US008944896B2

(12) United States Patent  (10) Patent No.: US 8,944,896 B2
Womac et al.  (45) Date of Patent: Feb. 3, 2015

(54) APPARATUS, SYSTEM, AND METHOD FOR VENTING A CHASSIS

(75) Inventors: David J. Womac, St. Charles, IL (US); Kimon Papakos, Chicago, IL (US); Scott A. Blakemore, Warrenville, IL (US)

(73) Assignee: Tellabs Operations, Inc., Naperville, IL (US)

( * ) Notice: Subject to any disclaimer, the term of this patent is extended or adjusted under 35 U.S.C. 154(b) by 1930 days.

(21) Appl. No.: 12/036,029

(22) Filed: Feb. 22, 2008

(65) Prior Publication Data

US 2008/0233858 A1   Sep. 25, 2008

Related U.S. Application Data

(60) Provisional application No. 60/902,985, filed on Feb. 22, 2007.

(51) Int. Cl.
*H05K 7/20* (2006.01)
*H05K 7/14* (2006.01)
(Continued)

(52) U.S. Cl.
CPC ............ *H05K 7/1425* (2013.01); *H05K 5/0213* (2013.01); *G06F 1/20* (2013.01); *H05K 7/18* (2013.01)
USPC .......................................... 454/184; 361/690

(58) Field of Classification Search
CPC ................................ H05K 5/0213; G06F 1/20
USPC ............................................. 54/184; 454/184
See application file for complete search history.

(56) References Cited

U.S. PATENT DOCUMENTS

| 2,917,676 A | 12/1959 | Daniels ........................... 317/99 |
| 2,987,364 A | 6/1961 | Fall ................................. 312/335 |

(Continued)

FOREIGN PATENT DOCUMENTS

| JP | 2001-345578 | 12/2001 |
| JP | 2001-345578 A | 12/2001 |

OTHER PUBLICATIONS

Converting Multi-Degree SBOADM Configurations, 76.7144FP41/25, Tellabs 7100 Optical Transport System. Tellabs, Inc., Revision A, Jun. 2007. 220 sheets.

(Continued)

*Primary Examiner* — Steven B McAllister
*Assistant Examiner* — Frances H Kamps
(74) *Attorney, Agent, or Firm* — Fitzpatrick, Cella, Harper & Scinto

(57) ABSTRACT

An apparatus, system, and method are provided for venting an enclosure, such as a chassis housing electronic equipment. The method includes receiving, at least one air directing surface, airflow moving in a first direction, the at least one air directing surface being disposed externally from the chassis at a predetermined placement relative to the at least one ventilation surface in a path of the airflow. The at least one air directing surface has a configuration to alter the direction of the airflow between the air directing surface and the at least one ventilation surface. The method also includes redirecting the airflow between the at least one air directing surface and the at least one ventilation surface to at least a second direction using the air directing surface. The predetermined placement and configuration of the at least one air directing surface determine the second direction in which the airflow is discharged, and the second direction is either towards or away from the at least one ventilation surface. Also in the receiving, the airflow is received at least one air directing surface of a bracket configured to attach the chassis to a mounting structure.

20 Claims, 23 Drawing Sheets

(51) Int. Cl.
  *H05K 5/02* (2006.01)
  *G06F 1/20* (2006.01)
  *H05K 7/18* (2006.01)

(56) References Cited

U.S. PATENT DOCUMENTS

| | | | | |
|---|---|---|---|---|
| 3,081,139 | A | 3/1963 | Hines et al. | 312/351 |
| 4,553,674 | A | 11/1985 | Yoshikawa et al. | |
| 5,398,822 | A | 3/1995 | McCarthy et al. | |
| 5,896,273 | A | 4/1999 | Varghese et al. | 361/724 |
| 5,991,163 | A | 11/1999 | Marconi et al. | 361/788 |
| 5,995,368 | A * | 11/1999 | Lee et al. | 361/695 |
| 6,025,989 | A | 2/2000 | Ayd et al. | 361/695 |
| 6,181,549 | B1 | 1/2001 | Mills et al. | 361/683 |
| 6,195,493 | B1 | 2/2001 | Bridges | 385/134 |
| 6,347,714 | B1 | 2/2002 | Fournier et al. | |
| 6,388,891 | B1 | 5/2002 | Falkenberg et al. | 361/796 |
| 6,467,633 | B1 | 10/2002 | Mendoza | |
| 6,543,626 | B1 | 4/2003 | Mendoza | |
| 6,554,142 | B2 | 4/2003 | Gray | 211/26 |
| 6,594,148 | B1 | 7/2003 | Nguyen et al. | |
| 6,597,576 | B1 | 7/2003 | Smith et al. | 361/724 |
| 6,625,020 | B1 * | 9/2003 | Hanson et al. | 361/695 |
| 6,742,583 | B2 * | 6/2004 | Tikka | 165/291 |
| 6,796,438 | B2 | 9/2004 | Mendoza | |
| 6,823,063 | B2 | 11/2004 | Mendoza | |
| 6,824,312 | B2 | 11/2004 | McClellan et al. | 385/88 |
| 6,877,551 | B2 * | 4/2005 | Stoller | 165/47 |
| 6,912,129 | B2 * | 6/2005 | Baker et al. | 361/695 |
| 6,927,983 | B1 | 8/2005 | Beseth et al. | 361/796 |
| 7,085,133 | B2 * | 8/2006 | Hall | 361/695 |
| 7,087,840 | B2 | 8/2006 | Herring et al. | |
| 7,229,050 | B2 | 6/2007 | Schloss | |
| 7,259,961 | B2 * | 8/2007 | Lucero et al. | 361/695 |
| 7,283,359 | B2 * | 10/2007 | Bartell et al. | 361/695 |
| 7,286,348 | B2 * | 10/2007 | Vinson et al. | 361/695 |
| 7,312,993 | B2 * | 12/2007 | Bundza et al. | 361/696 |
| 7,316,606 | B2 * | 1/2008 | Shipley et al. | 454/184 |
| 7,362,941 | B2 | 4/2008 | Rinderer et al. | |
| 7,379,299 | B2 * | 5/2008 | Walsh et al. | 361/695 |
| 7,391,625 | B2 | 6/2008 | Mendoza | |
| 7,394,654 | B2 * | 7/2008 | Zieman et al. | 361/695 |
| 7,447,022 | B2 * | 11/2008 | Murakami et al. | 361/695 |
| 7,508,664 | B2 * | 3/2009 | Holland | 361/695 |
| 7,674,165 | B2 * | 3/2010 | Lu et al. | 454/184 |
| 7,701,714 | B2 * | 4/2010 | Shabany | 361/698 |
| 7,715,213 | B2 | 5/2010 | Mendoza | |
| 7,782,612 | B2 * | 8/2010 | Walsh et al. | 361/690 |
| 7,813,121 | B2 * | 10/2010 | Bisson et al. | 361/679.51 |
| 8,087,979 | B2 * | 1/2012 | Rasmussen | 454/184 |
| 8,096,861 | B2 * | 1/2012 | Hanafusa | 454/184 |
| 2003/0223196 | A1 | 12/2003 | Smith et al. | |
| 2004/0007347 | A1 * | 1/2004 | Stoller | 165/47 |
| 2004/0007348 | A1 * | 1/2004 | Stoller | 165/47 |
| 2004/0145869 | A1 | 7/2004 | Tanaka et al. | |
| 2004/0196631 | A1 | 10/2004 | Ueda et al. | |
| 2005/0052843 | A1 | 3/2005 | Baker et al. | |
| 2005/0068722 | A1 | 3/2005 | Wei | |
| 2005/0162831 | A1 | 7/2005 | Shum et al. | |
| 2005/0254210 | A1 | 11/2005 | Grady et al. | |
| 2005/0286222 | A1 * | 12/2005 | Lucero et al. | 361/690 |
| 2006/0126292 | A1 | 6/2006 | Pfahnl et al. | |
| 2006/0180556 | A1 | 8/2006 | Shih et al. | 211/26 |
| 2006/0225481 | A1 | 10/2006 | Kato et al. | 73/1.01 |
| 2006/0274515 | A1 | 12/2006 | Arthur et al. | 361/796 |
| 2006/0276121 | A1 * | 12/2006 | Rasmussen | 454/184 |
| 2007/0125518 | A1 * | 6/2007 | Kumar et al. | 165/80.3 |
| 2007/0159791 | A1 * | 7/2007 | Pongracz et al. | 361/690 |
| 2008/0205028 | A1 | 8/2008 | Papakos et al. | 361/826 |
| 2008/0217962 | A1 | 9/2008 | Boduch et al. | 296/204 |
| 2010/0126696 | A1 * | 5/2010 | Novotny et al. | 165/67 |

OTHER PUBLICATIONS

Converting Multi-Degree SBOADM Configurations, 76.7144FP42/25, Tellabs 7100 Optical Transport System. Tellabs, Inc., Revision B, Jan. 2008. 154 sheets.
Converting Multi-Degree SBOADM Configurations, 76.7144FP43/25, Tellabs 7100 Optical Transport System. Tellabs, Inc., Revision A, Apr. 2008. 158 sheets.
System Engineering, 76.7144FP43/6, Tellabs 7100 Optical Transport System. Tellabs, Inc., Revision A, Apr. 2008. 332 sheets.
Expansion Procedure, 76.7144FP43/13, Tellabs 7100 Optical Transport System. Tellabs, Inc., Revision A, Apr. 2008. 562 sheets.
*Thermal Computations for Electronic Equipment.* Gordon N. Ellison. Van Nostrand Reinhold Company Inc. 1984. pp. 141-160.
*2000-2001 Oriental Motor General Catalog, Section C, Cooling Fans,* http://www.orientalmotor.com/products/pdfs/CoolingFans/SectionCIntro_C2-C27.pdf, Oriental Motor U.S.A. Corp. 2000. pp. C-12, C-13, C-16, and C-22 to C-27.
*2005-2006 Oriental Motor General Catalog, Section F, Technical Reference, Motor and Fan Sizing, Fan Sizing Calculations,* http://www.orientalmotor.com/products/pdfs/F_TecRef/TecFanSiz.pdf Oriental Motor U.S.A. Corp. 2005. p. F-11.

* cited by examiner

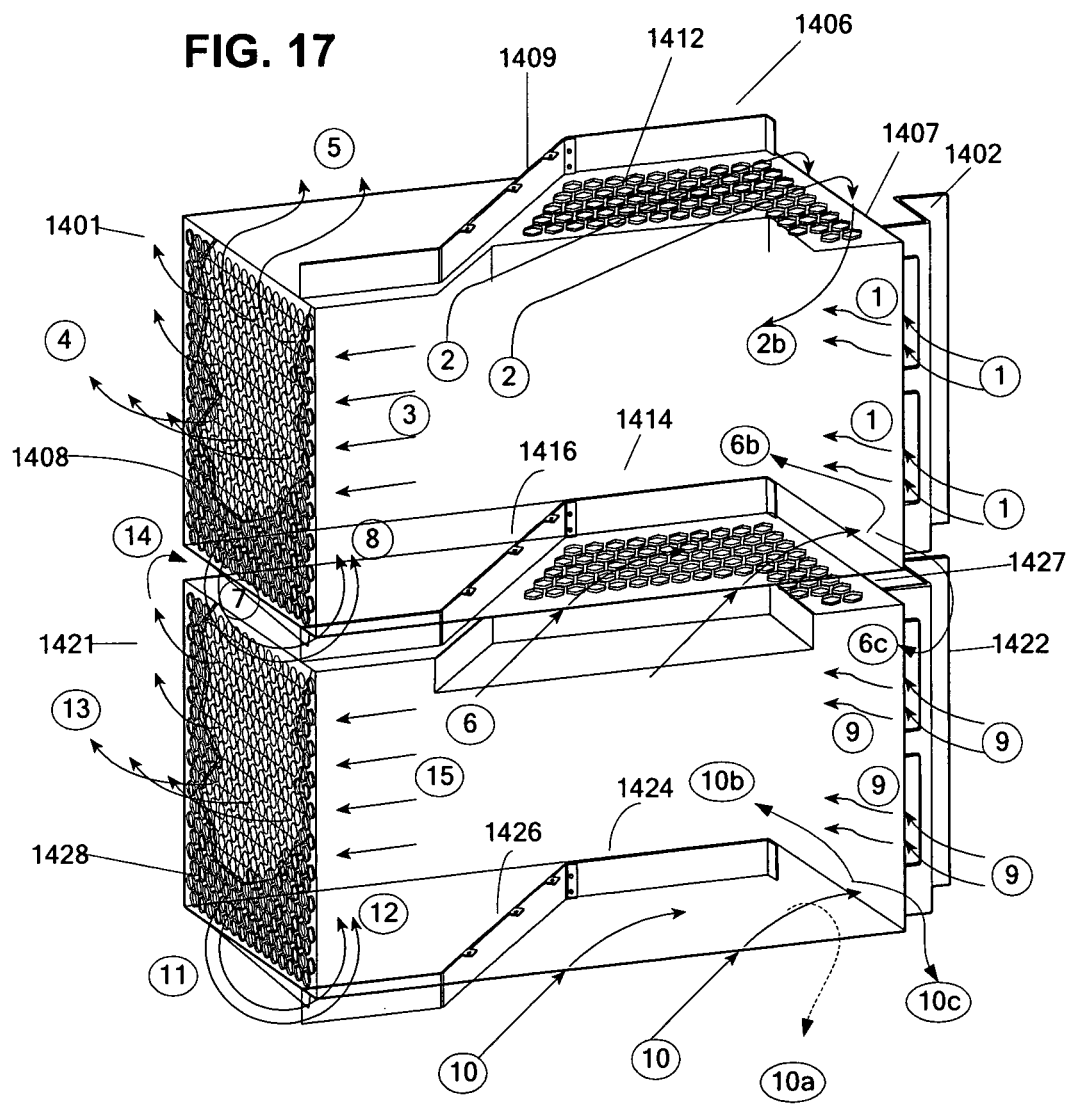

APPARATUS, SYSTEM, AND METHOD FOR VENTING A CHASSIS

CROSS REFERENCE TO RELATED APPLICATIONS

This application claims the benefit of priority under 35 U.S.C. §119(e) to U.S. provisional application No. 60/902,985, filed Feb. 22, 2007, the entire contents of which are incorporated by reference as if fully set forth herein, including Appendices 1-11.

FIELD

Example aspects of the present invention relate generally to an apparatus, system, and method for venting a chassis, and more specifically for venting a rack-mountable chassis enclosing heat generating components.

BACKGROUND

Modular electronic equipment typically is designed to be arranged within enclosures, such as cabinets, frames, and racks. Each enclosure typically includes a first and a second vertical structural support separated by a standard sized opening width, as adopted, for example, by industry, or manufacturers. In the United States telecommunications industry, for example, telecommunication service providers may use enclosures having opening widths of twenty-three (23) inches, whereas telephone companies in European countries may use racks having opening widths of nineteen (19) inches.

In addition to various standard enclosure opening widths, the different types of enclosures present different mounting environments that impact ventilation of equipment mounted in the enclosure. For example, a chassis may be required to be mounted inside an enclosed cabinet, having a front opening for receiving an inserted chassis and having solid vertical supports connected by a solid back panel. The solid supports and rear side may restrict horizontal and rearward airflow. In addition the reduced space between the components in the chassis and the vertical support may limit the size or configuration of cooling components such as cooling fans internal to the chassis.

As another example, a chassis may be mounted into a frame or rack having vertical supports having openings formed therein, and having no rear surface between the supports. The openings in the vertical supports permit airflow therethrough into and out of the chassis mounted to the rack. Of course, other mounting environments are possible.

Because of the various mounting environments, chassis are often configured specifically for their mounting geometry and mounting environment. This product specialization results in multiple models of chassis that are dependent on the mounting environment. This product specialization results in, for example, increased costs of design, manufacturing, installation, and maintenance.

SUMMARY

An apparatus, system, and method are provided for venting an enclosure, such as a chassis housing electronic equipment. The method includes receiving, at least one air directing surface, airflow moving in a first direction, the at least one air directing surface being disposed externally from the chassis at a predetermined placement relative to the at least one ventilation surface in a path of the airflow. The at least one air directing surface has a configuration to alter the direction of the airflow between the air directing surface and the at least one ventilation surface. The method also includes redirecting the airflow between the at least one air directing surface and the at least one ventilation surface to at least a second direction using the air directing surface. The predetermined placement and configuration of the at least one air directing surface determine the second direction in which the airflow is discharged, and the second direction is either towards or away from the at least one ventilation surface. Also in the receiving, the airflow is received at least one air directing surface of a bracket configured to attach the chassis to a mounting structure.

BRIEF DESCRIPTION OF THE DRAWINGS

Other features of the present invention will be more readily understood from the following detailed description of specific embodiments thereof when read in conjunction with the accompanying drawings, in which:

FIG. 17 shows a schematic of a system in accordance with an example embodiment of the invention.

Identically labeled elements appearing in different ones of the figures represent the same components and may not be described separately in detail in the description of each figure.

DETAILED DESCRIPTION

The terms "vertical" and "vertically," as used herein, mean extending in a plane substantially perpendicular to a reference surface, such as a horizontal surface or another reference surface. The term "horizontal" and "horizontally," as used herein, mean extending in a plane substantially parallel to the reference surface.

The apparatus, system, and method described herein can be used in conjunction with, for example, an equipment chassis which can be ventilated or cooled by forced airflow therethrough provided either by an air handling device that is included within the chassis or is provided externally and separately from the chassis. One example of a representative chassis is each chassis 1800 of the two rack-mountable-chassis (upper and lower) shown in FIG. 1. Each chassis 1800 is shown as having a first lateral surface 1814 and a second lateral surface 1806, and a top surface 1822, bottom surface 1823, front surface 1824, and rear surface 1825, which together form a chassis having a square or rectangular shape, although the chassis need not be square or rectangular in shape to be used in conjunction with the example aspects of the invention.

The first lateral surface 1814 and the second lateral surface 1806 each have at least one aperture 1829 formed therein to permit airflow therethrough. In addition to or instead of the apertures 1829 formed in the first and second lateral surfaces 1814, 1806, a chassis used in conjunction with example aspects of the invention each can have apertures formed in other areas of the chassis, such as, for example, in the top surface 1822 and/or bottom surface 1823.

Figure 1:
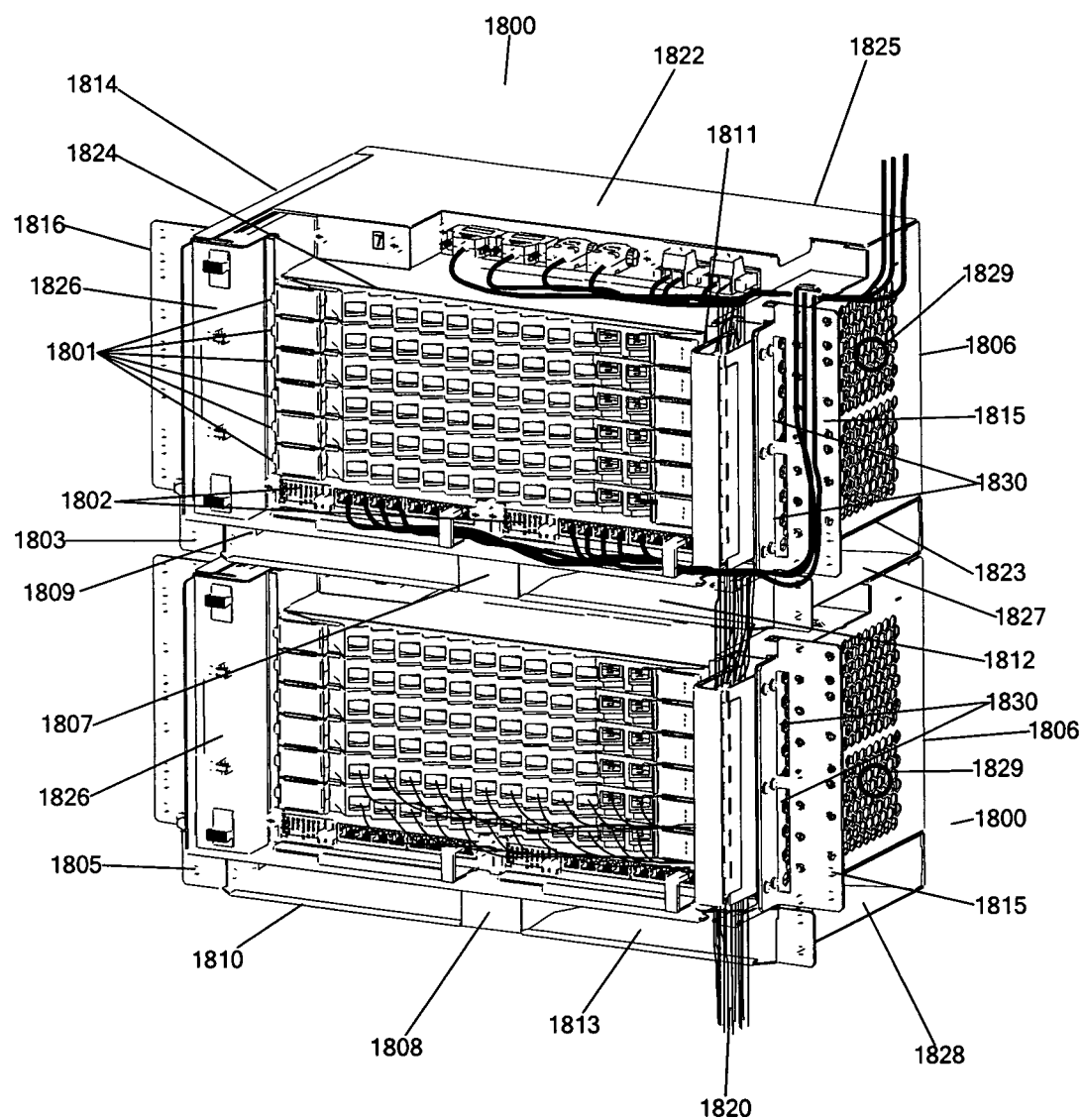
FIG. 1 shows a system comprised of apparatuses in accordance with an example embodiment of the invention.

In one example aspect of the invention, the chassis is configured with forced air cooling provided by a fan, such as a fan (not shown) in a compartment 1826 of FIG. 1, and the like. The fan may be positioned and configured to provide forced air movement through the chassis 1800 in a direction from the second lateral surface 1806 to the first lateral surface 1814, or vice versa. The chassis 1800 may also include an air filter (not shown) and/or air plenum (not shown), the air plenum being formed in one example embodiment, as an opening (not shown) in the front surface 1824 of the chassis 1800 on the intake side of the fan 1826 between module 1801 and the second lateral side 1806 that permits air to pass therethrough into the interior of the chassis 1800. The air plenum (not shown) provides at least one additional passage for air to enter the chassis through one of the surfaces of the chassis other than the first and second lateral surfaces 1806, 1814. The air entering from the plenum (not shown) can be subsequently mixed with air entering from at least one side of the chassis 1800 located on the intake side of the fan. For the purposes of the following description the intake side of the fan compartment 1826 is deemed to be to the right of the fan compartment 1826, and the direction of forced airflow through the chassis 1800 in FIG. 1 is from right to left, in the representation shown in FIG. 1.

Also shown in FIG. 1 is an example embodiment of a system for venting a chassis. The system includes a first air baffle 1803 (including divider 1807), disposed between the upper and lower-disposed chassis 1800, and a second baffle 1805 (including divider 1808) disposed below the lower-disposed chassis 1800. The baffles 1803, 1805 may be configured to be rack mountable (as shown) to rack supports (not shown for clarity). The air dividers 1807, 1808 are housed in housings 1827, 1828, respectively, which may include mounting features, such as flanges (as shown in FIG. 1), for rack-mounting the housings 1827, 1828. While the housings 1827, 1828 are not shown in FIG. 1 as including an aperture formed therein, it is to be understood that in another embodiment of the system at least one aperture may be formed therein that can permit airflow therethrough.

The system shown in FIG. 1 also includes a first bracket 1816 attached to the chassis at the first lateral surface 1814 and a second bracket 1815 attached to the chassis at the second lateral surface 1806. The first and second brackets 1815 and 1816, are configured to dispose the chassis relative to a mounting structure, such as, for example, the vertical supports of a rack (not shown) to provide gaps between (1) the first lateral surface 1814 and a portion of the mounting structure adjacent thereto (not shown) and (2) between the second lateral surface 1806 and another portion of the mounting structure adjacent thereto (not shown). The first and second brackets 1815, 1816 may have apertures formed therein that allow airflow therethrough, as is shown in FIG. 1. The gaps between the chassis 1800 and the mounting structure permit airflow in those gaps for air exchange into and out of the chassis 1800 through apertures 1829 formed in the second and first lateral surfaces 1806, 1814, respectively. This is especially useful when the configuration of the mounting structure (not shown) does not provide sufficient access to ventilation, such as when the vertical supports of a rack do not have apertures formed therein to permit adequate airflow therethrough, and also when the width of the chassis 1800 disposed in such a mounting structure does not provide sufficient clearance between the lateral surfaces 1814, 1806 and the adjacent mounting structure to permit airflow through apertures formed in those surfaces 1814, 1806.

Figure 2:
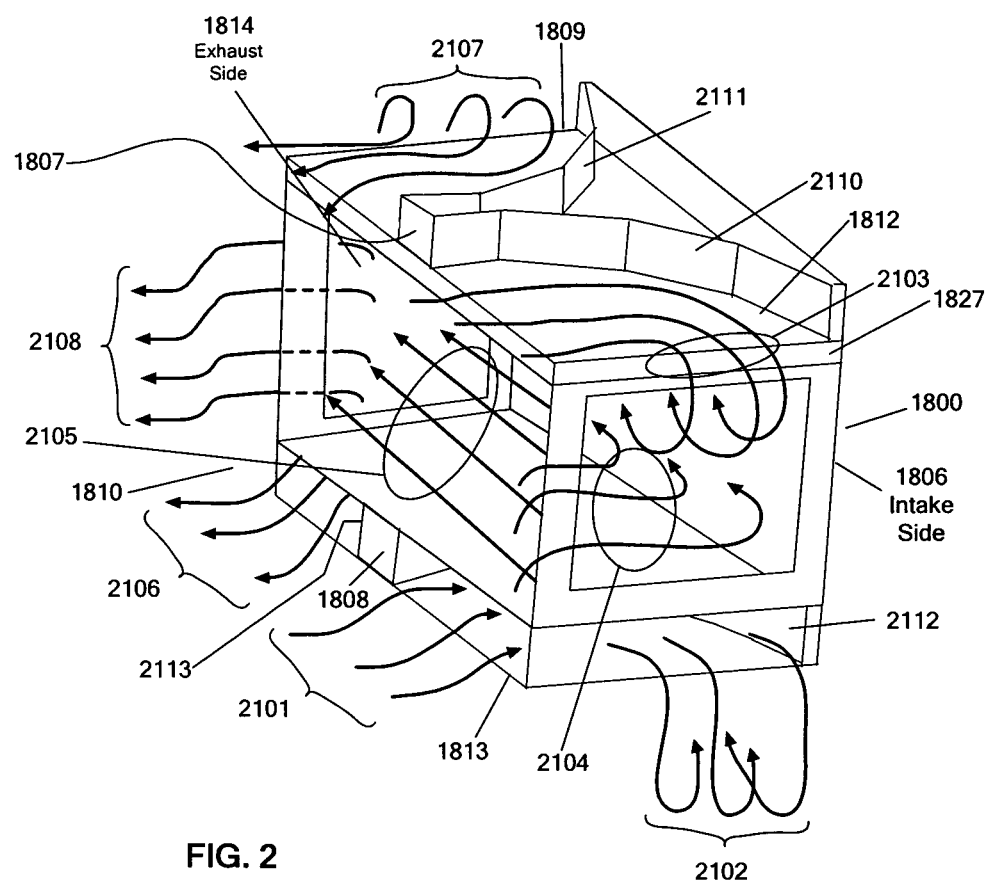
FIG. 2 is an airflow diagram in conjunction with an apparatus in accordance with an example embodiment of the invention.

FIG. 2 shows schematically an example air flow diagram of air flowing through part of the system shown in FIG. 1. The interior of the housing 1827 (FIGS. 1 and 2) of the air baffle 1803 is shown with an upper surface of the housing 1827 removed in FIG. 2 to show an example of the air divider 1807. It is to be understood that the housing 1827 may or may not be physically separable into multiple portions and the cutaway illustration shown in FIG. 2 is provided merely to provide an example of the interior of that housing 1827. The divider 1807's surfaces 2110, 2111 may be compound surfaces comprised of a plurality of sections of planar surfaces joined together at predetermined angles as shown in FIG. 2, although in other embodiments the surfaces may be curved or have other shapes and configurations other than those surfaces shown in FIG. 2. Also, for convenience details of the interior configuration of the housing 1828 (FIG. 1) are not shown in FIG. 2. However, the configuration of divider 1808 is preferably the same as that of air divider 1807, although in other embodiments the air dividers 1807 and 1808 have different configurations.

In FIGS. 1 and 2 the air dividers 1807, 1808 are attached to their respective housings 1827 (FIG. 1), 1828 (FIG. 1) along the edges of the surfaces 2110 (FIG. 2), 2111 (FIG. 2) at substantially ninety degree angles, although in other embodiments the surfaces may be attached at angles other than ninety degrees. The housings 1827 (FIG. 1), 1828 (FIG. 1) may be configured to be coextensive in size and shape with the surfaces of the chassis 1800 to which the housing 1827, 1828 are adjacently disposed. Moreover, the housings 1827, 1828 can include at least one aperture (not shown) that can be configured to be at least partially aligned with at least one aperture (not shown) formed in the surfaces of the chassis 1800 which are adjacent to the surface of the housing 1827, 1828 containing the aperture. For example, in the example embodiment of FIG. 1, an aperture (not shown) may be formed in a lower surface of inlet 1812 of the baffle housing 1827 which can partially align with a corresponding aperture in the top side 1822 of the chassis 1800 adjacent to and below that lower surface of the baffle housing 1827. Air entering the inlet 1812 can, under the suction created by the fan in the fan compartment 1826, be drawn into the inlet and through such apertures in the housing 1827 and the top side of the chassis 1822 adjacent to and below the housing 1827. Of course, this example embodiment is not meant to be limited to an aperture formed in only one surface of the housing 1827 (or chassis 1800), and it is fully within the scope of this invention that other or additional surfaces of housing 1827 and/or housing 1828 may include an aperture that may at least partially align with an aperture formed in at least one surface of the chassis 1800.

Air baffle 1803 (FIG. 1) includes an inlet 1812 through which air from the front of a chassis 1800 can be drawn towards the second lateral surface 1806 (and toward the gap created between the second lateral surface 1806 and the mounting structure (not shown) when the chassis 1800 is disposed adjacent to bracket 1815 (FIG. 1)). Forced airflow, provided by fan 1826, moves through the inlet 1812 and its direction is altered by the air directing surface 2110. Air deflected by the air directing surface 2110 is directed towards the second lateral surface 1806 (i.e., the intake) of the chassis 1800, as shown by airflow arrows 2103 whereupon it is directed downward at least by the mounting structure (not shown) facing the second lateral surface (1806). Therefore, the mounting structure (not shown) can also act as an air directing surface. The air directing surface 2110 directs the air flow 2103 from a first direction to a second direction (substantially towards the intake side 1806, and then a second air directing surface, such as, for example, a surface of the mounting structure (facing the intake side 1806, not shown in FIG. 2) can direct the air flow from a second direction to a third direction (e.g., shown with arrows 2103 as substantially downward in FIG. 2), prior to the air flow entering into an aperture 1829 (FIG. 1) in the intake side 1806. Likewise, air from the front of the chassis 1800, shown by arrows 2101, is directed through an intake 1813 of the air baffle 1805 (FIG. 1). The direction of airflow 2101 is altered by the air directing surface 2112 in a direction represented by airflow 2102 whereupon it is directed upwardly at least by the mounting structure (not shown) facing the second lateral surface 1806 and, towards the second lateral surface 1806 (i.e., the intake) whereupon it can then pass through at least one aperture 1829 formed in the second lateral surface 1806.

By virtue of apertures 1830 in the bracket 1815 (FIG. 1), air represented by arrows 2104 may also enter the gap formed between the mounting structure (not shown) and the second lateral surface 1806 from a region in front of the bracket 1815 through at least one aperture formed therein and be directed through the at least one aperture 1829 in the second lateral surface 1806, where the incoming air 2104 through the bracket 1815 can be mixed with the air entering after being deflected from the dividers 1807 and 1808 to form a bulk flow 2105 through the interior of the chassis 1800.

Likewise, bulk flow 2105 passes through the at least one aperture 1829 formed in the first lateral surface 1814 (FIG. 1) and is then directed upwards and/or downwards towards baffle exhausts 1809, 1810, respectively. A portion of the bulk flow 2105 can be directed upwards and/or downwards by the mounting structure (not shown) facing the first lateral surface 1814. Forced airflow represented by arrows 2107, 2106 can enter respective exhausts 1809, 1810 from the gap between the mounting structure (not shown) and the first lateral surface 1814 and can be directed toward the front of the chassis 1800 by air directing surfaces 2111 of air divider 1807 and 2113 (not completely shown) of air divider 1808 (not completely shown). Air represented by arrows 2107 and 2106 can move from the respective exhausts 1809, 1810 to a region in front of the chassis 1800 (i.e., towards the left in FIG. 2). Air can pass from the exhaust side 1814 to a region in front of the bracket 1816 (FIG. 1) through at least one aperture formed therein, as shown by airflow arrows 2108.

Because air entering the chassis 1800 can be drawn from a region in front of the chassis and air exiting the chassis can be directed to a region in front of the chassis, the entering and exiting airflows can come into contact and mix. A mixture of air comprised of air that has already passed through the chassis 1800 (i.e., exhaust air) and air (i.e., fresh air) that has not already passed through the chassis 1800 can therefore mix and be introduced into the baffle (e.g., 1803, 1805) and chassis 1800. To mitigate the effect of the exhaust from mixing with fresh air, further air directing surfaces may be positioned with respect to the chassis to further direct the exhaust and fresh air airflows away from each other. Such additional air directing surfaces can, for example, modify the airflow around the chassis, such as that shown in FIG. 2.

Figure 3:
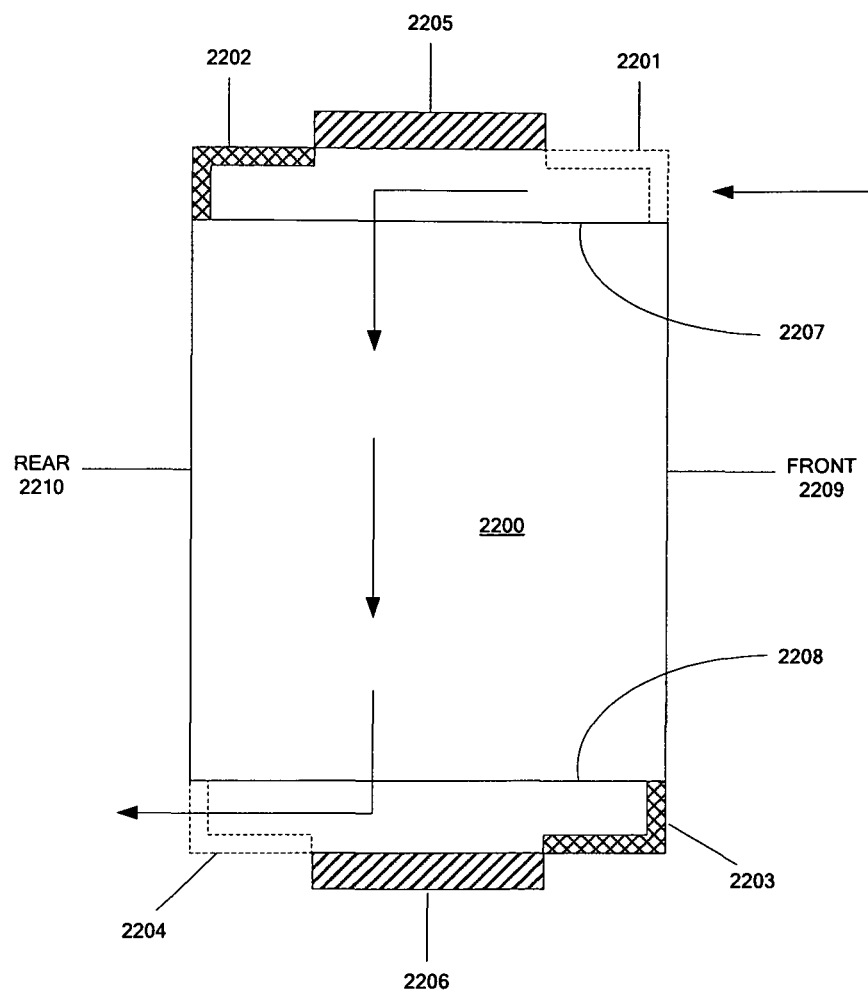
FIG. 3 is an airflow diagram in conjunction with an apparatus in accordance with an example embodiment of the invention.

In another example embodiment of the enclosure venting system, the incoming and exhaust airflows are further separated by directing air with respect to a chassis according to the schematic shown in FIG. 3. In FIG. 3 air is directed into chassis 2200 substantially from the front 2209 at a first lateral side and exhausting air is ejected from the chassis 2200 substantially to an opposite lateral side 2208 and then to the rear 2210 of the chassis. The ventilation system, shown schematically as a cross-sectional view in FIG. 3, includes air directing surfaces of elements 2201-2206, which may include the surfaces of mounting elements such as brackets (e.g., 2201-2204), and a mounting structure (e.g., 2205, 2206) connected thereto. The mounting elements 2201-2204 can dispose a chassis 2200 at a certain position relative to the mounting structure 2205, 2206 so as to create gaps between the chassis 2200 and the mounting structure 2205, 2206. Elements shown hatched (e.g., 2202, 2205, 2203, 2206) are substantially free of apertures, while elements shown surrounded by dotted lines (e.g., 2201, 2204) have at least one aperture formed therein that permit air to pass therethrough.

In one example embodiment, the air directing surfaces of elements 2201-2206 are configured to be disposed externally from the chassis 2200 at a predetermined placement relative to the ventilation surfaces 2207, 2208 of the chassis 2200, and are also configured to redirect air received from a first direction to a second direction, either towards or away from the ventilation surface 2207, 2208. In the example embodiment shown in FIG. 3, the surfaces of elements 2201-2204 (e.g., surfaces of mounting brackets), in conjunction with the surfaces of elements 2205, 2206 (e.g., surfaces of the mounting structure), are configured to direct air substantially in a pathway shown by the solid arrows beginning at the front surface 2201 and ending at the rear surface 2204.

In another example embodiment (not shown), elements 2201, 2202, and 2205 may be formed as a single assembly including an air directing surface. Likewise, in another example embodiment (not shown), elements 2203, 2204, and 2205 may be similarly formed as a single assembly including an air directing surface. Also, elements 2201 and/or 2204 need not be present in order to reduce obstruction to airflow. Such combined assemblies also can be configured, to block the passage of airflow through an oppositely facing aperture formed in mounting elements (e.g., 2205, 2206), if present.

In the example embodiment shown in FIG. 3, air enters the chassis 2200 substantially from the front side 2209 and exhausts substantially at the rear side 2210, as is shown in FIG. 3. A plurality of elements 2201-2204 (e.g., mounting brackets) are used to mount the chassis 2200 to the elements 2205, 2206 (e.g., mounting structure). In the embodiment shown in FIG. 3 the front element 2201 (e.g., bracket) connecting the second side 2207 of the chassis 2200 to the element 2205 (e.g., mounting structure) can have at least one aperture formed therein on at least one surface to permit airflow therethrough from the region to the right of element 2201 towards the side 2207 of the chassis 2200. Side 2207 has at least one aperture (not shown) formed therein to permit airflow therethrough.

Once beyond the element 2201, the air is directed by the solid surfaces of the element 2205 and the element 2202 (e.g., substantially free of apertures formed therein) towards the second lateral side 2207 of the chassis 2200 and through at least one aperture (not shown) formed therein into the interior of the chassis 2200 and on through to the first lateral side 2208, which also contains at least one aperture (not shown) formed therein that permits airflow therethrough. Upon passing through at least one aperture (not shown) formed in the first lateral side 2208 the air can be substantially directed rearward to the region to the left of element 2204 (e.g., bracket) by being redirected by the surfaces of the element 2206 (e.g., mounting structure) and the element 2203 (e.g., solid front mounting bracket). The airflow can pass through at least one aperture formed in the element 2204 (e.g., rear mounting bracket). While the resulting airflow path (represented as solid lines) into, through, and out of the chassis is shown in FIG. 3 substantially as an s-shaped path, an s-shaped path need not be provided and in other embodiments other airflow path shapes may be provided.

Figure 3A:
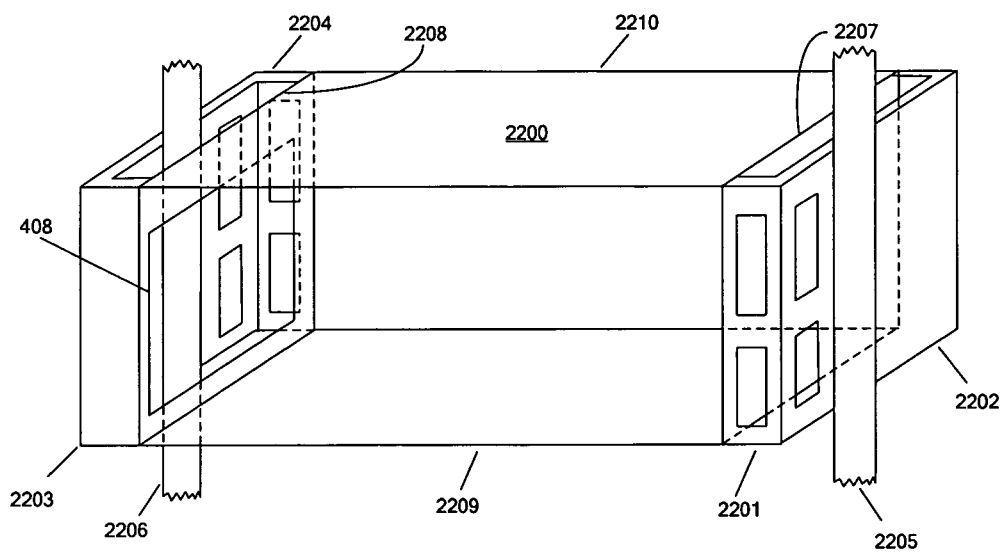
FIG. 3A shows schematically a perspective view of a system like that shown in FIG. 3, viewed from the front, using at least one apparatus shown in a cross-sectional view in FIG. 3, in accordance with an example embodiment of the invention.

FIG. 3A shows a perspective view of the enclosure 2200 and the elements 2201-2206 of FIG. 3, shown as a cross section viewed from a top or bottom.

Figure 4A:
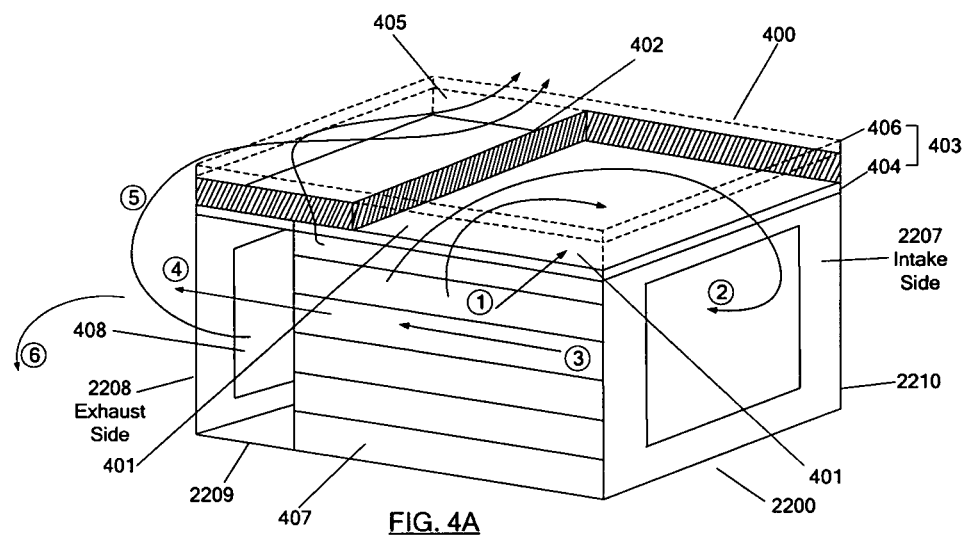
FIG. 4A shows an apparatus used in a system in accordance with an example embodiment of the invention.

FIG. 4A shows yet another example embodiment of an enclosure venting system that, in one example embodiment, can include the components of the system of FIG. 3 (but which have not been shown in FIG. 4A for clarity), and which includes at least one air baffle 400 comprised of at least one air directing surface 402 disposed adjacent to a surface of a chassis (e.g., chassis 2200). When the components of the example embodiment of the system shown in FIG. 3 are combined with the components of the example embodiment of the system shown in FIG. 4A, the cross sectional view shown in FIG. 3 can also represent a cross section of the example embodiment of the system comprised of the combination of components.

The enclosure 2200 of FIG. 4A is shown including module slots 407 which are locations in which modules (i.e., modular electronic components) can be inserted and received into the chassis 2200. Also in FIG. 4A, the enclosure is shown including a fan compartment or slot 408, which can be used to house fans (not shown) which can move air through the chassis 2200. A baffle 400 is configured with an air intake 401 to direct air from a region in front of the intake 401 towards second lateral side 2207 of the chassis 2200. Further, the baffle 400 has an air exhaust 405 to direct exhaust air rearward and away from the chassis 2200 and the baffle 400.

Figure 4B:
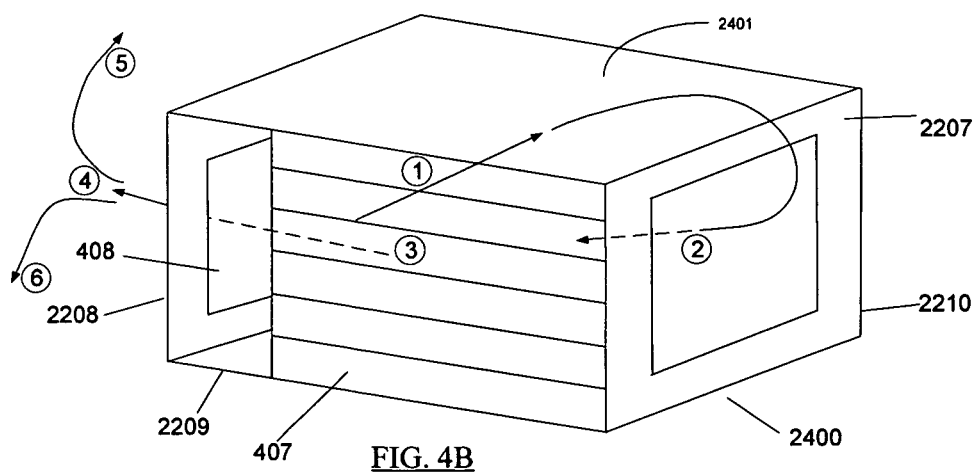
FIG. 4B shows an apparatus used in a system in accordance with an example embodiment of the invention.
Figure 4C:
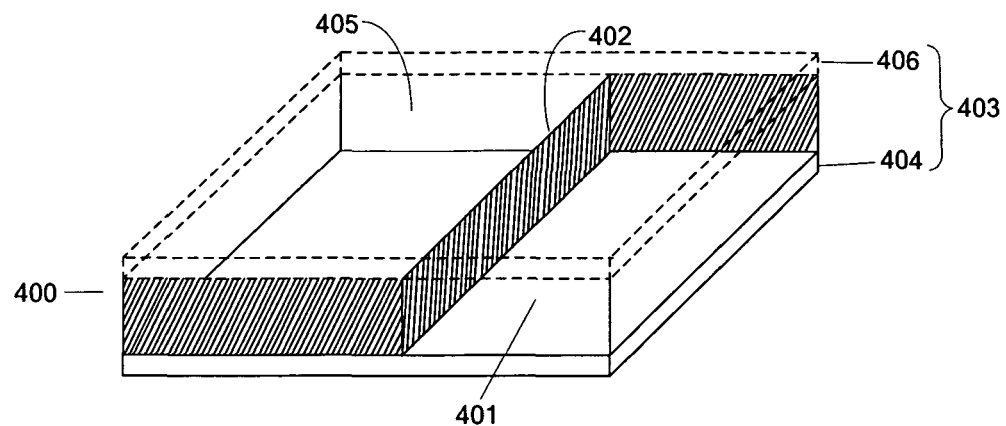
FIG. 4C shows an apparatus used in a system in accordance with an example embodiment of the invention.

An example embodiment of the baffle 400 shown in FIG. 4A is shown in FIG. 4C. The baffle 400 can include a housing 403 having a top side 406 and a bottom side 404 to house the air directing surface 402 and may also include a mounting surface to mount the baffle 400 to a mounting structure, such as an equipment rack, or to a surface of the chassis so as to dispose the surface 402 in a desired position relative to at least one ventilation surface (e.g., intake side 2207, exhaust side 2208) of the chassis 2200. The top side 406 of the housing 403 is shown in FIG. 4C outlined with dotted lines to conveniently show an example of the interior of the baffle 400. The housing 403 can be attached to at least one edge of the air directing surface 402, such as along the surfaces of the sides 404 and 406 facing the interior of the housing. In one example embodiment, the air directing surface 402 is not housed, and is instead configured to be placed separately at a predetermined position with respect to a ventilation surface (e.g., 2207, 2208) of the chassis 2200. Moreover, in other example embodiments, the air directing surface 402 can be integrally formed with the enclosure 2200. The sides 406 and 404 in one example are substantially free of apertures through which air can pass.

Figure 4D:
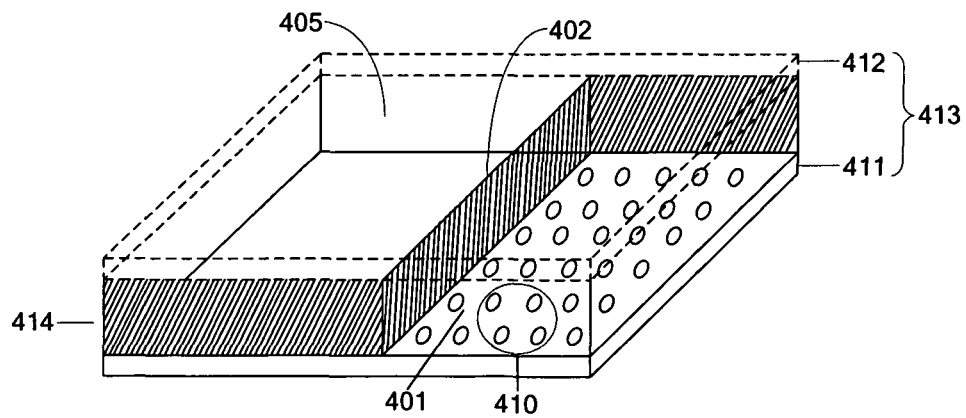
FIG. 4D shows an apparatus used in a system in accordance with an example embodiment of the invention.

Another example embodiment of a baffle 414 is shown in FIG. 4D that includes a housing 413 that includes a bottom side 411 that has at least one aperture 410 formed therein. The housing 413 also includes a top side 412, shown with dotted lines to show detail of the interior of the housing 413. While not shown in FIG. 4D, in another alternative embodiment, other portions of housing other than those shown in FIG. 4D, such as, for example, the top side 412, may also include at least one aperture.

The chassis 2200 shown in FIGS. 3 and 4A is also shown in FIG. 4B with the baffle 400 removed. By virtue of the substantially solid surface of the top side 2211 of the chassis 2200, air (represented by arrow number 1) moving towards the intake side 2207 can pass through an aperture in the intake side 2207 (as represented by arrow number 2). The bulk air flow (represented by arrow number 3 passes through the chassis 2200 towards the exhaust side 2208 and through at least one aperture 408 (represented by arrow number 4). The air can then be redirected by another surface, such as a mounting surface positioned facing the aperture 408 to redirect the air in directions including upwards and/or downwards (represented by arrows numbered 5 and 6, respectively).

The embodiments of the chassis 2200 shown in FIGS. 4A and 4B are not intended to limit the scope of the invention to only being used in conjunction with a specific configuration of chassis or enclosure (e.g., chassis 2200), and the invention can also be practiced with other configurations of chassis or enclosures not specifically shown herein. For example, while not shown, a chassis similar to chassis 2200 (FIGS. 4A, 4B) may be configured to be used in conjunction with at least one of the example embodiments of the invention having at least one aperture formed in at least one side other than (and/or in addition to) sides 2207, 2208 (FIG. 4B). Such a chassis may include at least one aperture formed in a side that may at least partially align with an aperture formed in a side of a housing (e.g., 414) or be obstructed by a side of a housing (e.g., 400, 414). In such a case, air flow around such a chassis may be different from that shown with respect to chassis 2200 (FIGS. 4A, 4B).

The example embodiments of the systems shown in FIGS. 3 and 4A may be employed independently, as described above, or in combination to provide additional ventilation access to the chassis 2200. For example, ventilation access for the chassis 2200 depicted in the example embodiment shown in FIGS. 3 and 3A may be supplemented by introducing at least one baffle (e.g., 400 (FIG. 4C), 414 (FIG. 4D)) to the system shown in FIGS. 3 and 3A, adjacent to at least one of a top side, bottom side, and/or between the top side of one chassis 2200 and the bottom side of another adjacent chassis 2200. Alternatively, ventilation access for the chassis 2200 depicted in the example embodiment shown in FIGS. 4A and 4B may be supplemented by introducing and positioning elements 2201-2206 around the chassis 2200 in the manner shown in FIGS. 3 and 3A. For example, element 2201 (FIGS. 3, 3A) can be attached to the intake side 2207 (FIGS. 3, 3A, 4A, 4B) near the front side 2209 (FIGS. 3, 3A, 4A, 4B) of the chassis 2200 (FIGS. 3, 3A, 4A, 4B), while element 2202 (FIGS. 3, 3A) can be attached to the intake side 2207 (FIGS. 3, 3A, 4A, 4B) near the rear side 2210 (FIGS. 3, 3A, 4A, 4B) of the chassis 2200 (FIGS. 3, 3A, 4A, 4B). Similarly, element 2203 (FIGS. 3, 3A) could be attached to the exhaust side 2208 (FIGS. 3, 3A, 4A, 4B) near the front side 2209 (FIGS. 3, 3A, 4A, 4B) of the chassis 2200 (FIGS. 3, 3A, 4A, 4B) and element 2204 (FIGS. 3, 3A) could be attached to the exhaust side 2208 (FIGS. 3, 3A, 4) near the rear side of the chassis 2202 (FIGS. 3, 3A, 4A, 4B). The chassis 2200 (FIGS. 3, 3A, 4A, 4B) could then be attached to elements 2205 and 2206 (FIGS. 3, 3A) through elements 2201-2204 (FIGS. 3, 3A) as shown in FIGS. 3 and 3A.

In the example embodiment where the systems shown in FIGS. 3, 3A, and 4A are combined, air directed into the air intake 401 by the baffle 400 can be mixed with incoming airflow entering through element 2201 (e.g., bracket), shown in FIG. 3. Likewise, at least a portion of air exhausted from side 2208 of FIG. 3 through element 2204 (e.g., bracket) can also be deflected along the surfaces of elements 2206 and 2203 to exit through the exhaust 405 (FIGS. 4A, 4C, 4D).

Figure 5:
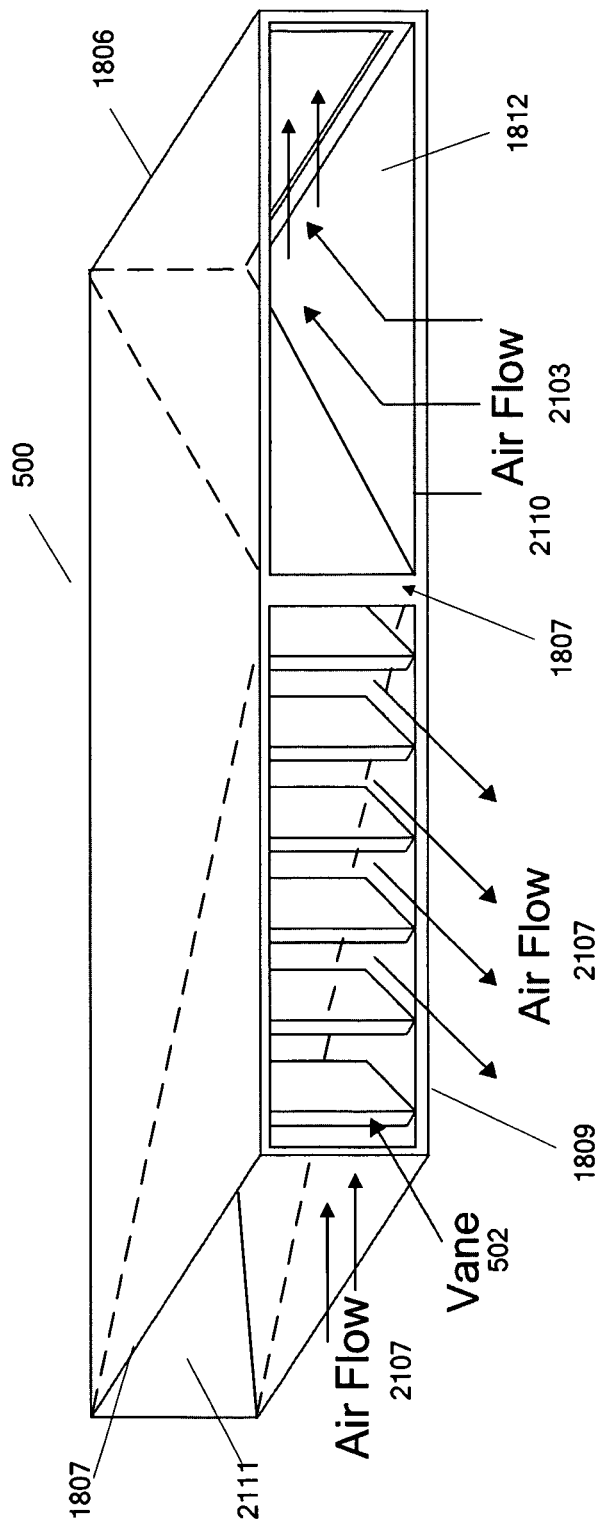
FIG. 5 shows an apparatus used in a system in accordance with an example embodiment of the invention.

For example, in another example embodiment a baffle 500 is shown in FIG. 5 configured as a modification of the baffle 1803 shown in FIGS. 1 and 2. The exhaust 1809 of baffle 500 includes at least one additional air directing surface 502, such as a vane, which can further direct and separate and reduce the mixing of intake air (represented by arrows 2103) with exhaust air (represented by arrows 2107) so that the amount of such mixed air entering the inlet 1812 is reduced. Air flow through the baffle 500 is substantially the same as the airflow through the baffle 1803 shown in FIG. 2, except for the airflow represented by arrows 2107 across the vanes 502 shown in FIG. 5 to direct the airflow 2107 away from the intake of baffle 500.

In other example embodiments, the inlet 1812 of baffle 500, may also include additional air directing surfaces, such as, for example, the vanes 502, while in another example embodiment such vanes 502 can be provided for the inlet 1812 but not for the exhaust 1809, or can be provided for both the inlet 1812 and the exhaust 1809.

The vanes 502 can be positioned at a selected angle relative to the front edge of the baffle 500. The angle is suitable to change the direction of air that flows through the exhaust 1809 to a direction away from the intake in order to reduce the intake of a mixture of air that contains exhaust air (i.e., away from the inlet 1812 of baffle 500). As shown in FIG. 5, the vanes are angled to direct the exhaust air to a region in front of and to the left of the baffle 500. In other example embodiments the position (i.e., angle) of the vanes 502 can be adjustable through use of an adjusting mechanism, while in other embodiments the position (i.e., angle) of the vanes 502 can be non-adjustable.

The vanes 502 can extend inwardly by a suitable distance from the front edge of the exhaust 1809 of baffle 500. While the vanes 502 are shown in FIG. 5 as planar surfaces, in other embodiments the vanes may not be planar, and may have other surface shapes, including being curved. Also, while the exit 1809 is shown as including at least one additional air directing surface (e.g., vane 502), in other example embodiments of a baffle at least one additional air directing surface may be included at other locations of the baffle 500, in place of, or in addition to, those locations shown in FIG. 5.

Figure 7:
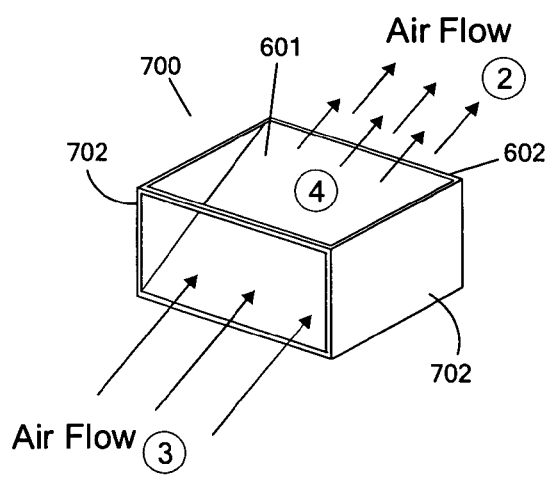
FIG. 7 shows a perspective view of an apparatus used in a system in accordance with an example embodiment of the invention.
Figure 7A:
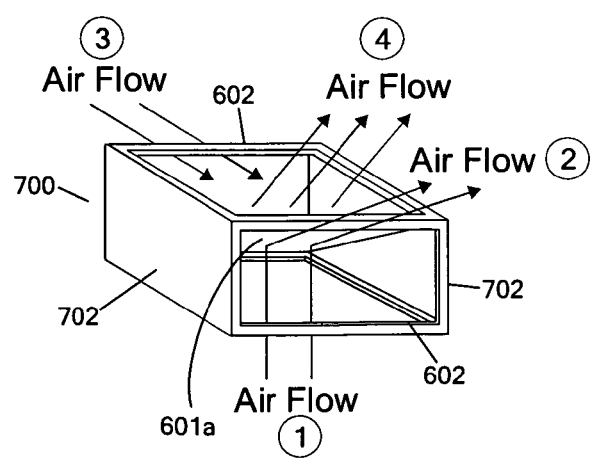
FIG. 7A shows a perspective view of the apparatus shown in FIG. 7.
Figure 8:
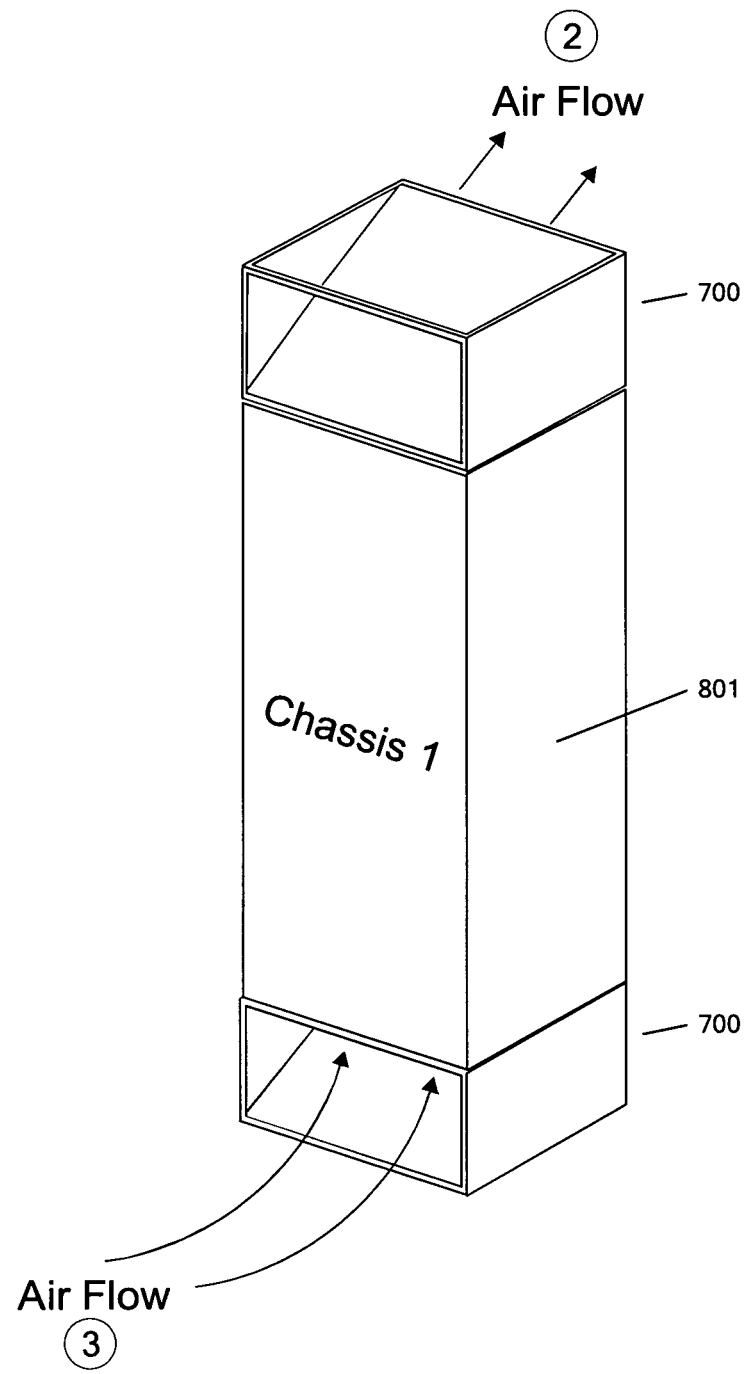
FIG. 8 shows a system in accordance with an example embodiment of the invention.

Another example embodiment of an enclosure venting system is shown in FIG. 8, which facilitates the venting of at least one enclosure having ventilation surfaces that are substantially transverse to an axis, such as a vertical axis. The system shown in FIG. 8 includes at least one baffle 700 that can be positioned adjacent to a ventilation surface of a chassis 801. In FIG. 8 the chassis 801 is oriented lengthwise vertically, and each baffle 700 is shown disposed adjacent to each one of two opposite sides of the chassis 801. Air entering (and/or leaving) the chassis 801 can be directed by at least one surface of the baffle 700 (an example of which is further represented in FIGS. 6-7A), an example interior of which is represented in FIG. 6.

The chassis 801 can be disposed in a supporting structure, such as, for example, a rack, or can be attached to a wall or other structure, which may also be configured with an air directing surface. For example, a surface of a rack or a wall in proximity to the baffle 700, can be configured to redirect heated air exhausted from the upper one of the baffles 700 shown in FIG. 8, further away from the baffle, such as, for example, towards one or more of a heating, ventilation, or air conditioning system (not shown).

Figure 6:
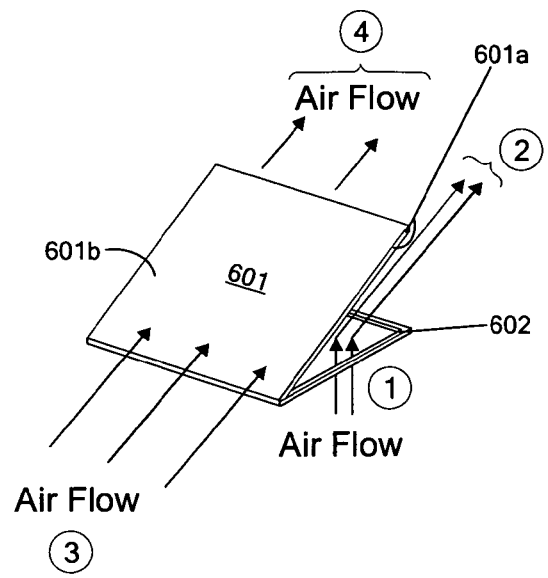
FIG. 6 shows an apparatus used in a system in accordance with an example embodiment of the invention.

FIG. 7 shows a perspective view of the baffle 700 and FIG. 7A shows another perspective view of the baffle 700, as viewed from an opposite perspective from that of FIG. 7. The baffle 700 shown in FIGS. 7 and 7A includes at least one air directing surface 601, shown separately in FIG. 6, to direct air along a path directed by that surface relative to at least one ventilation surface of the chassis 801. In FIG. 6, air directing surface 601 is shown positioned at an angle relative to surface 602. In one example, surface 602 includes at least one aperture formed therein to permit air to pass therethrough. In the example embodiment shown in FIG. 6 the surfaces 601 and 602 form a predetermined acute angle forming a space between those facing surfaces. Surface 602 is shown as substantially a rectangular or square shaped frame having a single aperture, however, surface 602 may include more than one aperture and may have other shapes.

As shown by the airflow arrows in FIGS. 6, 7, and 7A, air can be directed along both an inner side 601a and an outer side 601b of surface 601 depending upon the direction of the incoming air flow. As shown in FIGS. 6 and 7A, airflow (1) passing upwardly through at least one aperture in surface 602 (i.e., from a ventilation surface of Chassis 1 of FIG. 8) may enter the space formed between surfaces 601 and 602 and be directed along the inner side 601a in the direction of the air flow arrows (2). Moreover, air (3) can be directed by the outer side 601b of surface 601 (from the left in FIG. 6) as shown in FIGS. 6, 7, and 7A, by air flow arrows (4) (i.e., toward a ventilation surface of Chassis 1 of FIG. 8). While surfaces 601 and 602 are shown in FIGS. 6, 7, and 7A as planar surfaces, in other embodiments those surfaces may have other geometries, including curved shapes.

In addition to the surfaces 601 and 602 shown in FIG. 6, the baffle 700 (FIGS. 7 and 7A) also includes oppositely facing side surfaces 702 attached at, or otherwise in contact with, opposite edges of surface 601. The additional side surfaces 702 further decrease the surface area through which air enters and exits from the baffle 700, and can limit the movement of air transverse to the direction of airflow direction shown by the solid arrows in FIG. 7.

Figure 8A:
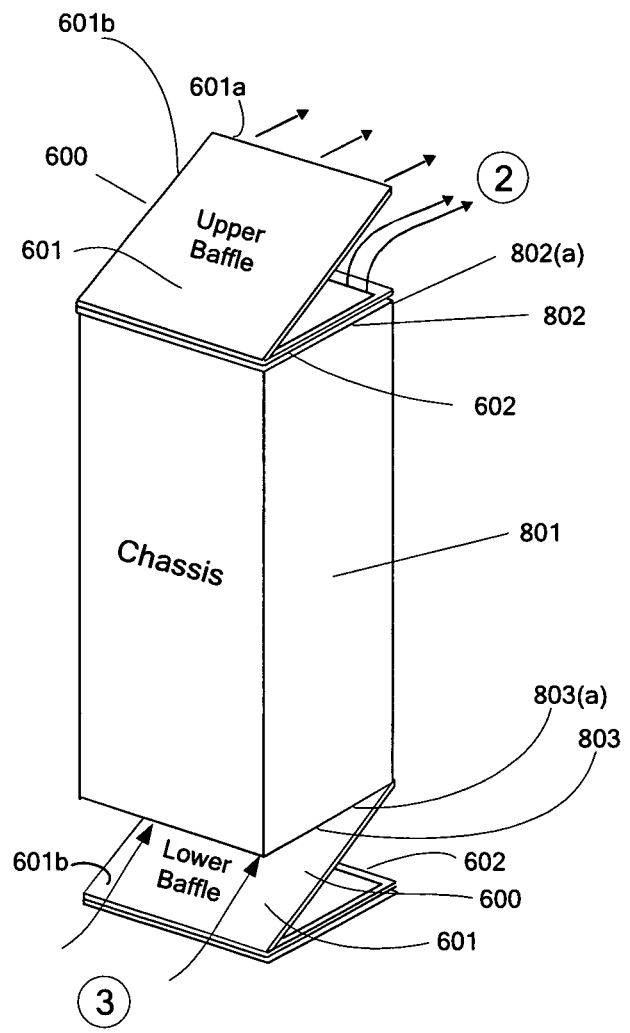
FIG. 8A shows the system of FIG. 8 shown with at least one surface of each of the baffles removed for greater clarity.

The system shown in FIG. 8, is further represented in FIG. 8A with the surfaces 601 and 602 of the baffles 700 exposed and surfaces 702 removed for clarity. In addition, the chassis 801 is shown having a first ventilation surface 802 that includes at least one aperture 802*a* that permits air to pass therethrough. In addition, the chassis 801 includes a second ventilation surface 803 (not shown) that also includes at least one aperture 803*a* (not shown) that permits air to flow therethrough.

Surfaces 601 and 602 of an upper disposed baffle are positioned relative to the first ventilation surface 802 of the chassis 801, so that at least one aperture of surface 602 can be at least partially aligned with at least one aperture 802(*a*) of the ventilation surface 802. Air, represented by arrows numbered 2, passing from the chassis 801 through the at least partially aligned apertures can pass through the first ventilation surface 802 and through surface 602 of the upper-disposed baffle to enter the space between surfaces 601 and 602. Such air entering the space between the surfaces 601 and 602 is directed along the inner side 601*a* of surface 601. The surface 601 of the upper-disposed baffle 700 is positioned with respect to surface 602 to direct the exhaust air in the direction shown by the arrows numbered 2.

Surfaces 601 and 602 of a lower disposed baffle are positioned relative to the second ventilation surface 803 of the chassis 801, so that at least one aperture of surface 602 can be at least partially aligned with at least one aperture 803(*a*) of the ventilation surface 803 and so that air, represented by arrows numbered 3, received on the outer side 601*b* of surface 601 can be redirected towards the second ventilation surface 803.

Figure 9:
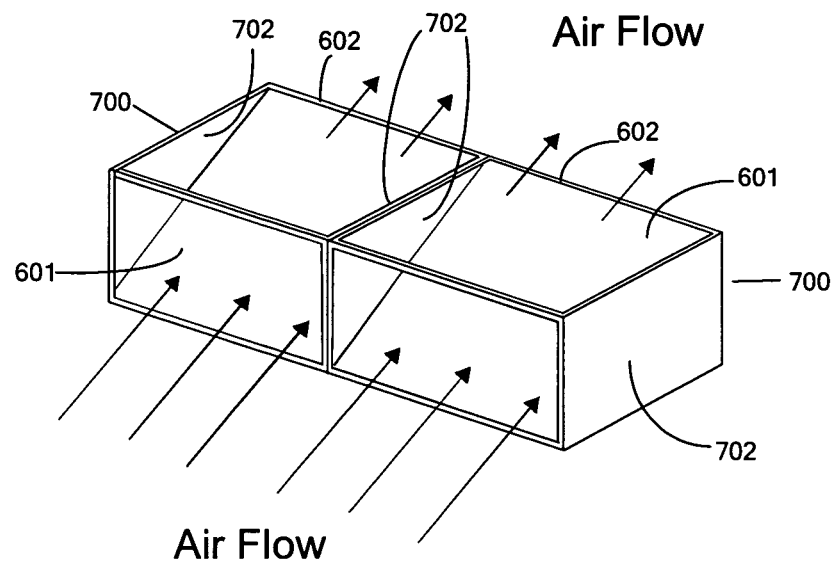
FIG. 9 shows an apparatus used in a system in accordance with an example embodiment of the invention.
Figure 9A:
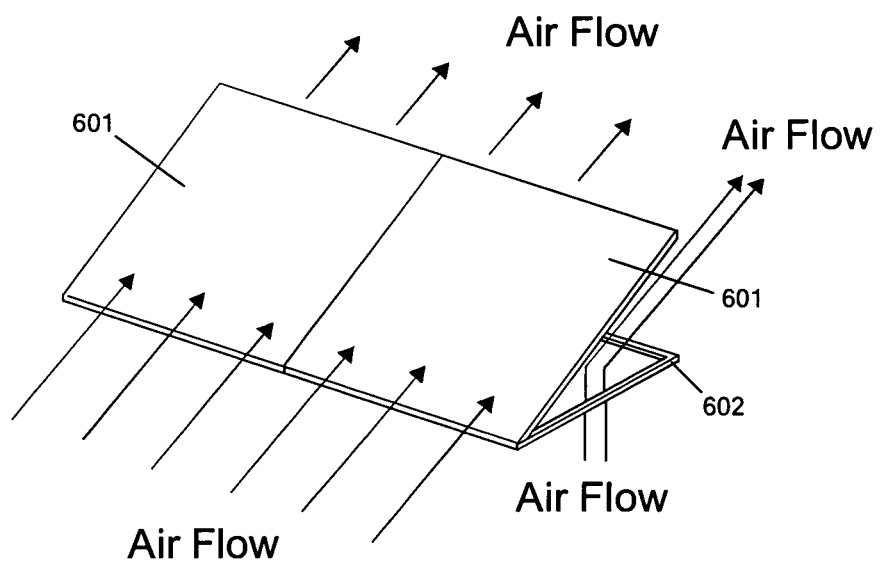
FIG. 9A shows portions of the interior of the apparatus of FIG. 9.
Figure 12:
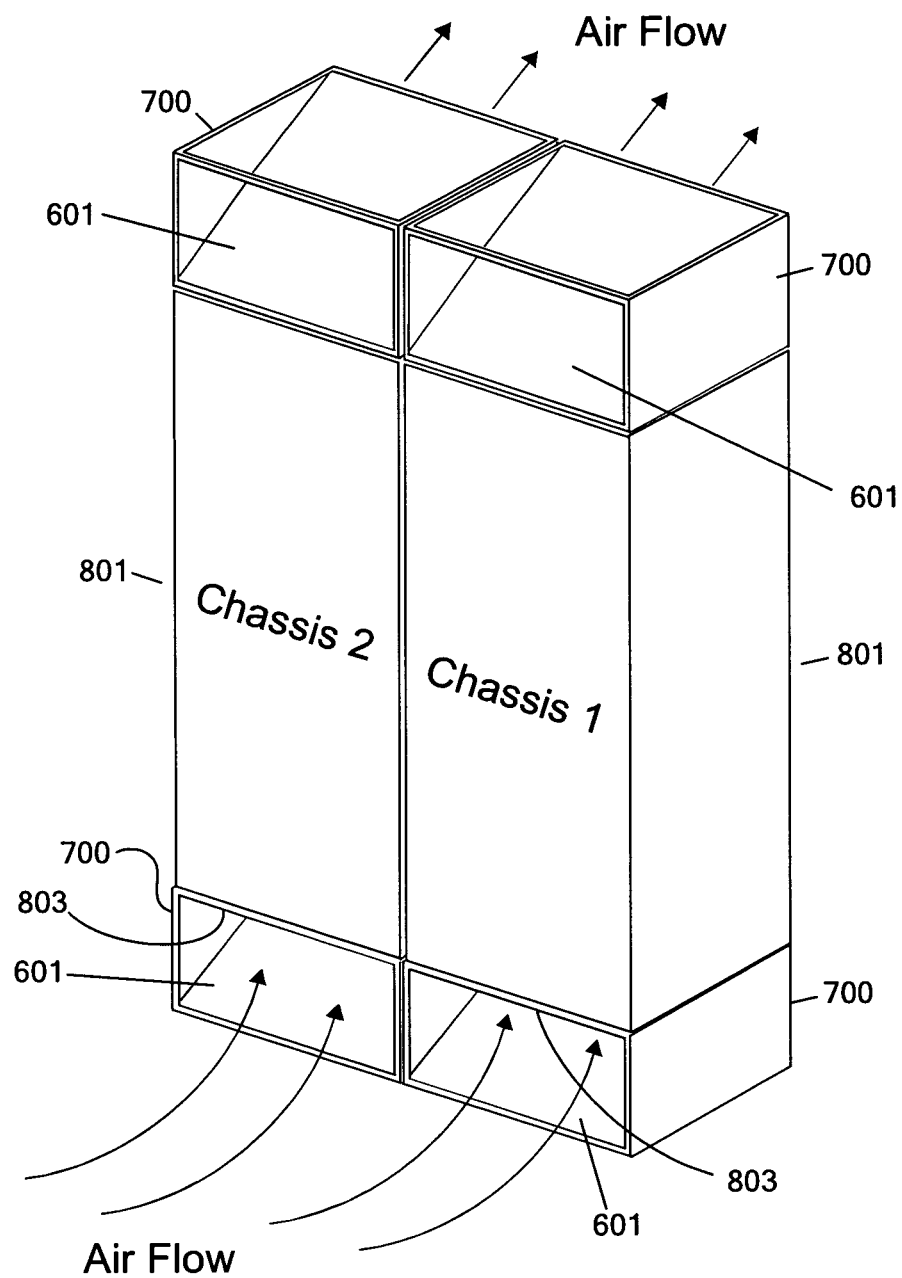
FIG. 12 shows a system in accordance with an example embodiment of the invention.

The system shown in FIG. 8 may be expanded to a system for venting a plurality of vertically oriented chassis 801 that are positioned horizontally adjacent to one another, an example of which is shown in FIG. 12. In FIG. 12, each chassis 801 is shown positioned adjacent to one another and positioned between upper- and lower-disposed baffles 700. A set of the baffles 700 of FIG. 12 is further represented in FIG. 9 in which two baffles 700 are shown positioned abutting each other along oppositely facing surfaces 702. The arrangement of the surfaces 601 within baffles 700 shown in FIG. 9 is shown in greater detail in FIG. 9A, which shows a plurality of surfaces 601 that are positioned adjacent to one another at abutting edges, wherein the surfaces 702 are removed. Surfaces 602 of those baffles also are positioned adjacent to one another at abutting edges.

Figure 12A:
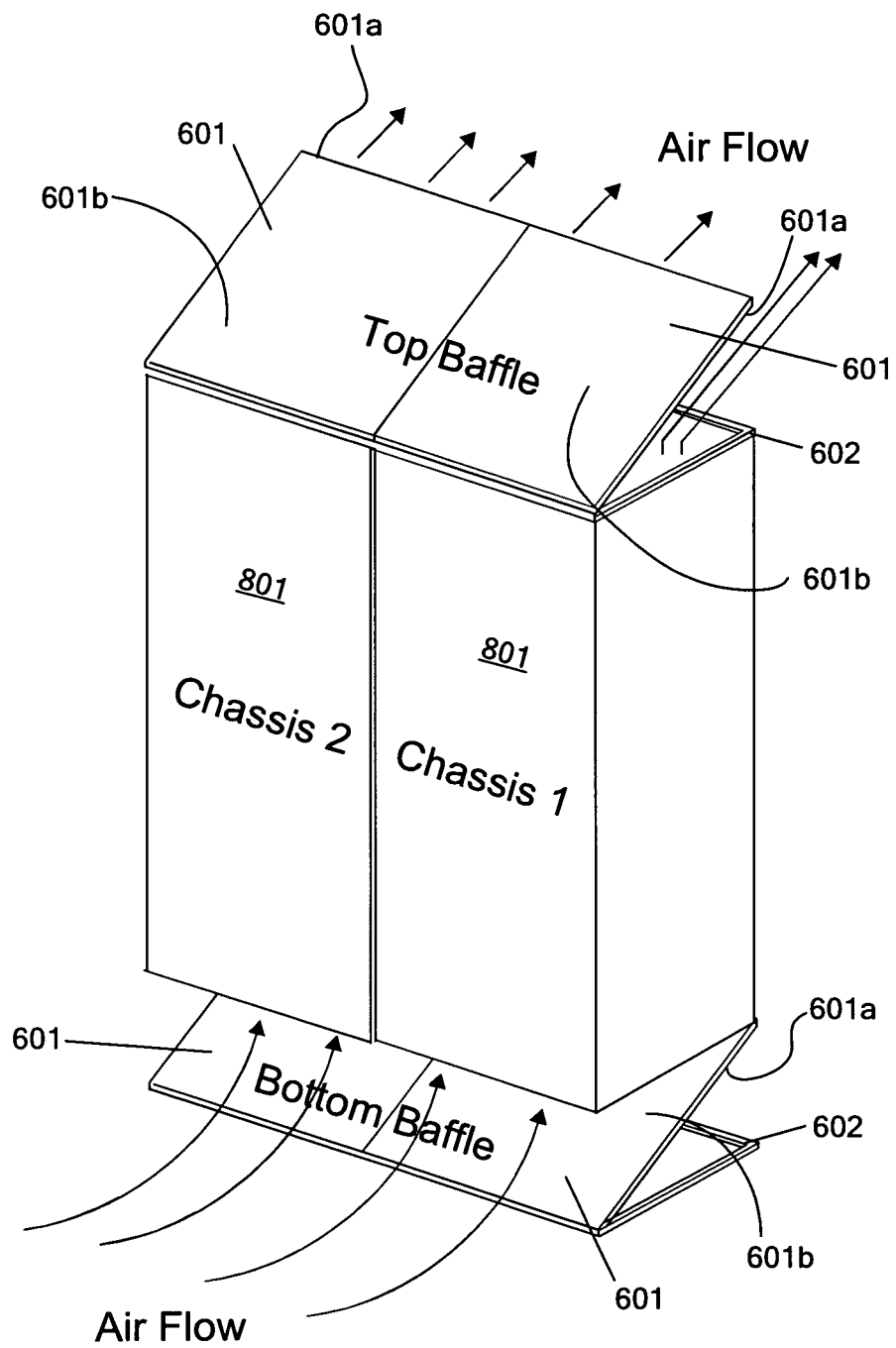
FIG. 12A shows the system of FIG. 12, with portions of the baffles shown removed for greater clarity.

Referring again to FIG. 12, air is directed by the lower disposed baffles 700 toward the second ventilation surfaces 803 of each chassis 801. Air entering the chassis 801 can be exhausted through the first ventilation surface 802 (not shown in FIG. 12) and through the upper-disposed baffles 700. FIG. 12A shows the system shown in FIG. 12 with the surfaces 601 and 602 of baffles 700 exposed and the other parts of the baffles 700 removed for greater clarity. Exhausted air can be directed by the inner side 601*a* of surface 601 and surface 602 and moves in the direction of the arrows away from the upper-disposed baffle 700.

While only two chassis 801 and their corresponding baffles 700 are shown in FIG. 12, in other example embodiments other numbers of chassis and/or baffles can be used.

Figure 11:
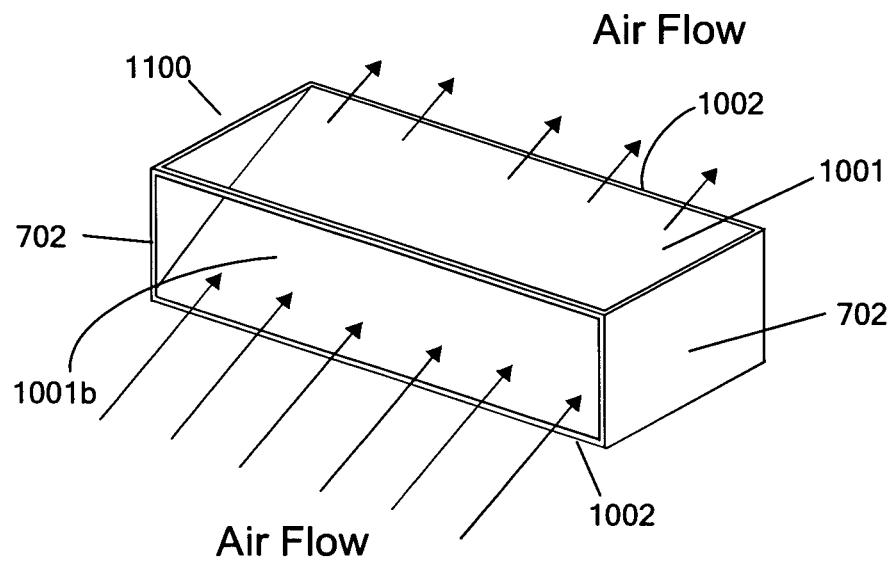
FIG. 11 shows a perspective view of an apparatus used in a system in accordance with an example embodiment of the invention.
Figure 11A:
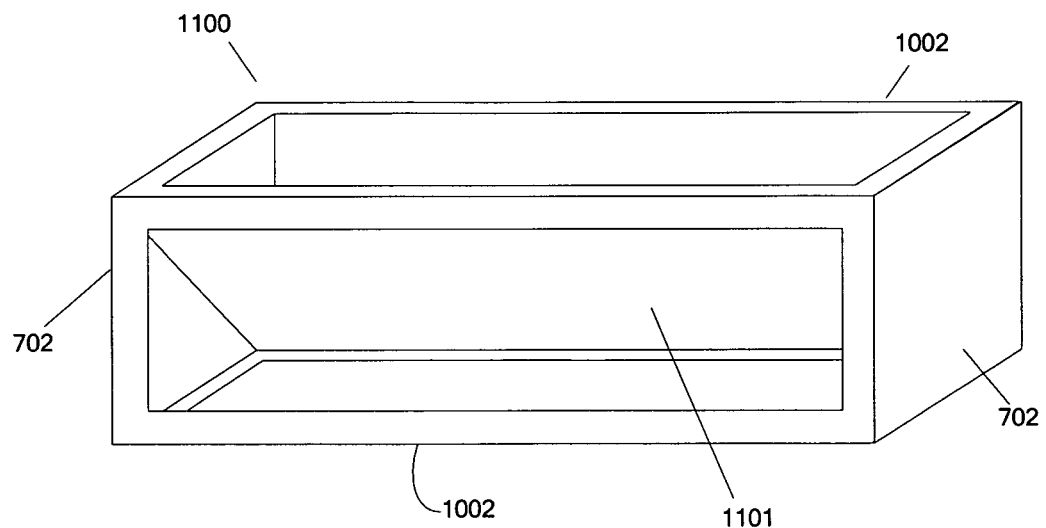
FIG. 11A shows another perspective view of the apparatus shown in FIG. 11.
Figure 12B:
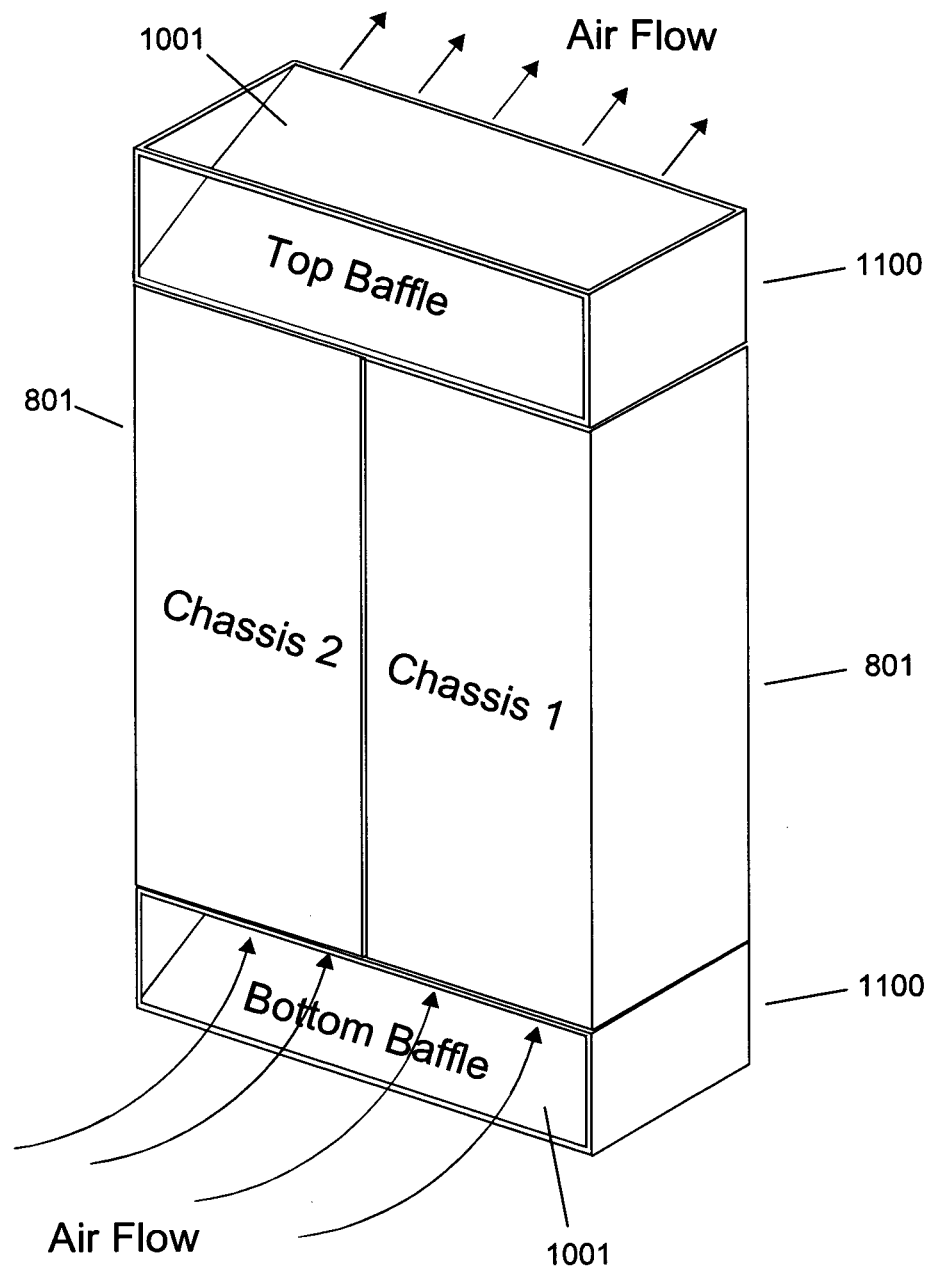
FIG. 12B shows a system in accordance with an example embodiment of the invention.

In another example embodiment shown in FIG. 12B, the plurality of upper and lower disposed baffles 700 shown in FIG. 12, can be replaced with upper and lower individual common baffles 1100, respectively. An individual common baffle 1100 is also shown in FIG. 11 and is comprised of a surface 1001 disposed at an angle relative to at least one other surface 1002. FIG. 11 shows a perspective view of the individual common baffle, showing at least part of outer side 1001*b* of surface 1001 shown in FIG. 10. FIG. 11A shows another perspective view of the individual common baffle 1100 as viewed from a different perspective, showing at least part of inner side 1001*a* of surface 1001 and surface 1002, shown in FIG. 10. In FIGS. 11 and 11A, surfaces 702 are attached at opposite edges of surfaces 1001 and 1002. As shown in FIGS. 11 and 11A, surface 1002 includes at least one aperture through which air can pass therethrough. Surfaces 702 and 1001 are substantially free of such apertures.

Figure 10:
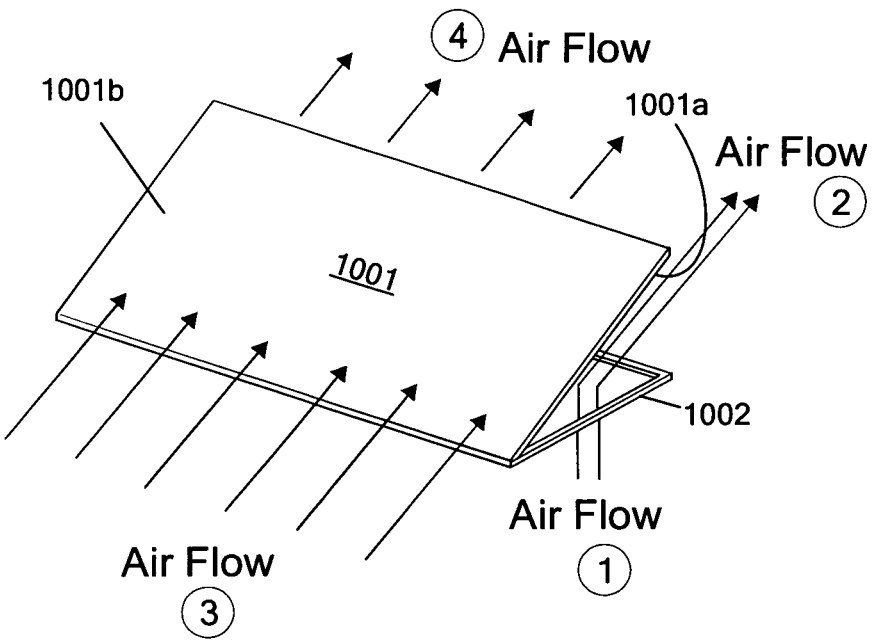
FIG. 10 shows a portion of an apparatus shown in FIG. 11, in accordance with an example embodiment of the invention.

The surfaces 1001 and 1002 are shown in greater detail in FIG. 10. As shown by the airflow arrows in FIG. 10, air can be directed along both an inner side 1001*a* and an outer side 1001*b* of surface 1001 depending upon the direction of the incoming air flow. Also, airflow (1) passing upwardly through at least one aperture in surface 1002 may enter the space formed between surfaces 1001 and 1002 and be directed along side 1001*a* in the direction of the air flow arrows (2). Moreover, air (3) flowing over the outer side 1001*b* of surface 1001 (from the left in FIG. 10) will be directed as shown by air flow arrows (4). While surfaces 1001 and 1002 are shown in FIG. 10 as planar surfaces, in other embodiments the surfaces may have other geometries, including curved shapes.

It can be useful to use a common baffle, such as the baffle 1100, to serve a plurality of chassis in order to simplify installation, for example, where chassis are rack-mounted. For example, where the baffle 1100 is sized to fit within a standard sized equipment mounting rack, such as a standard electronic equipment rack having a nominal nineteen inch opening width, the baffle may be sized to fit within the rack opening width so that a plurality of chassis can be served by at least one common baffle rather than separate individual baffles.

Figure 12C:
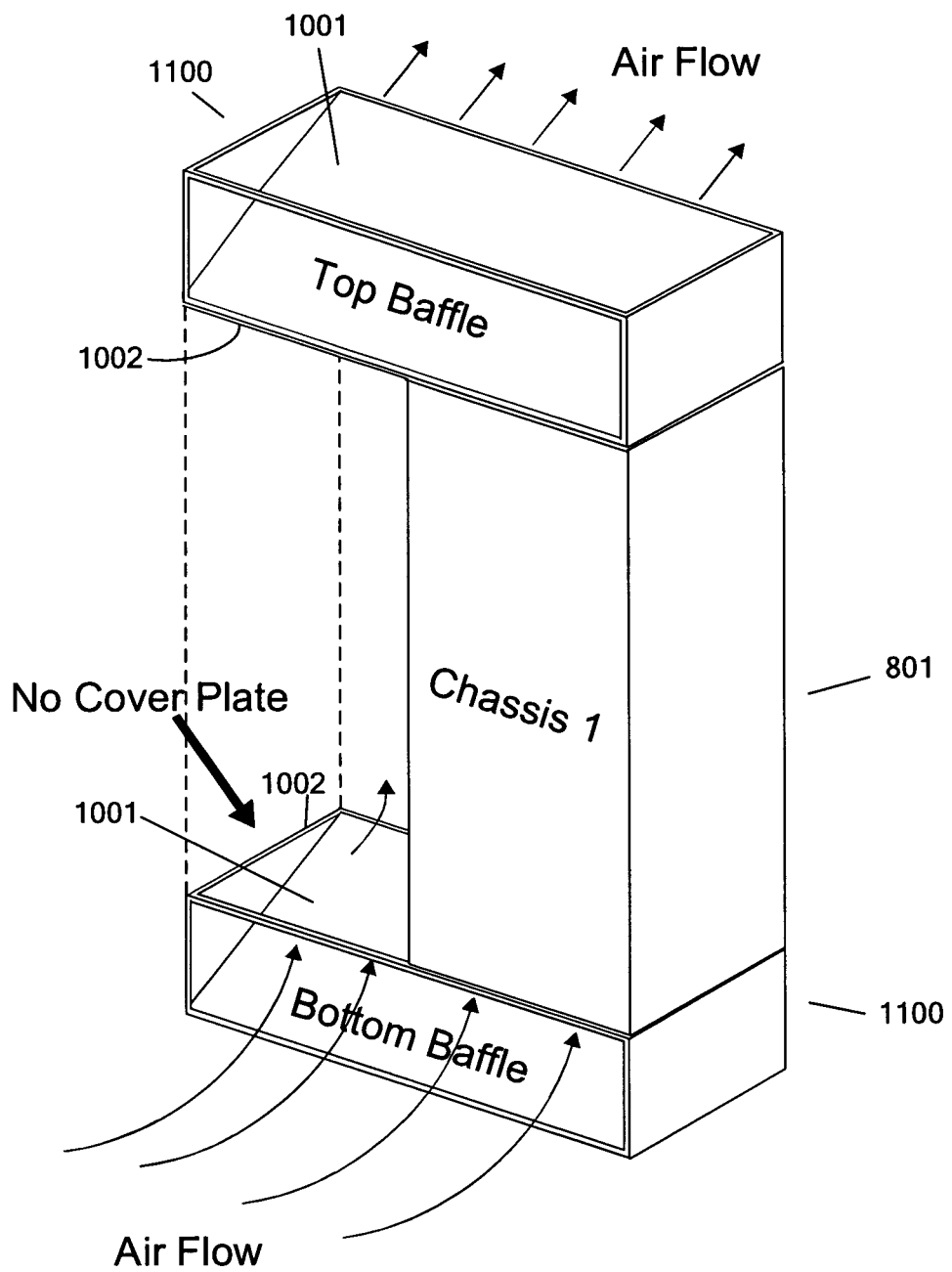
FIG. 12C shows a system in accordance with an example embodiment of the invention.
Figure 12D:
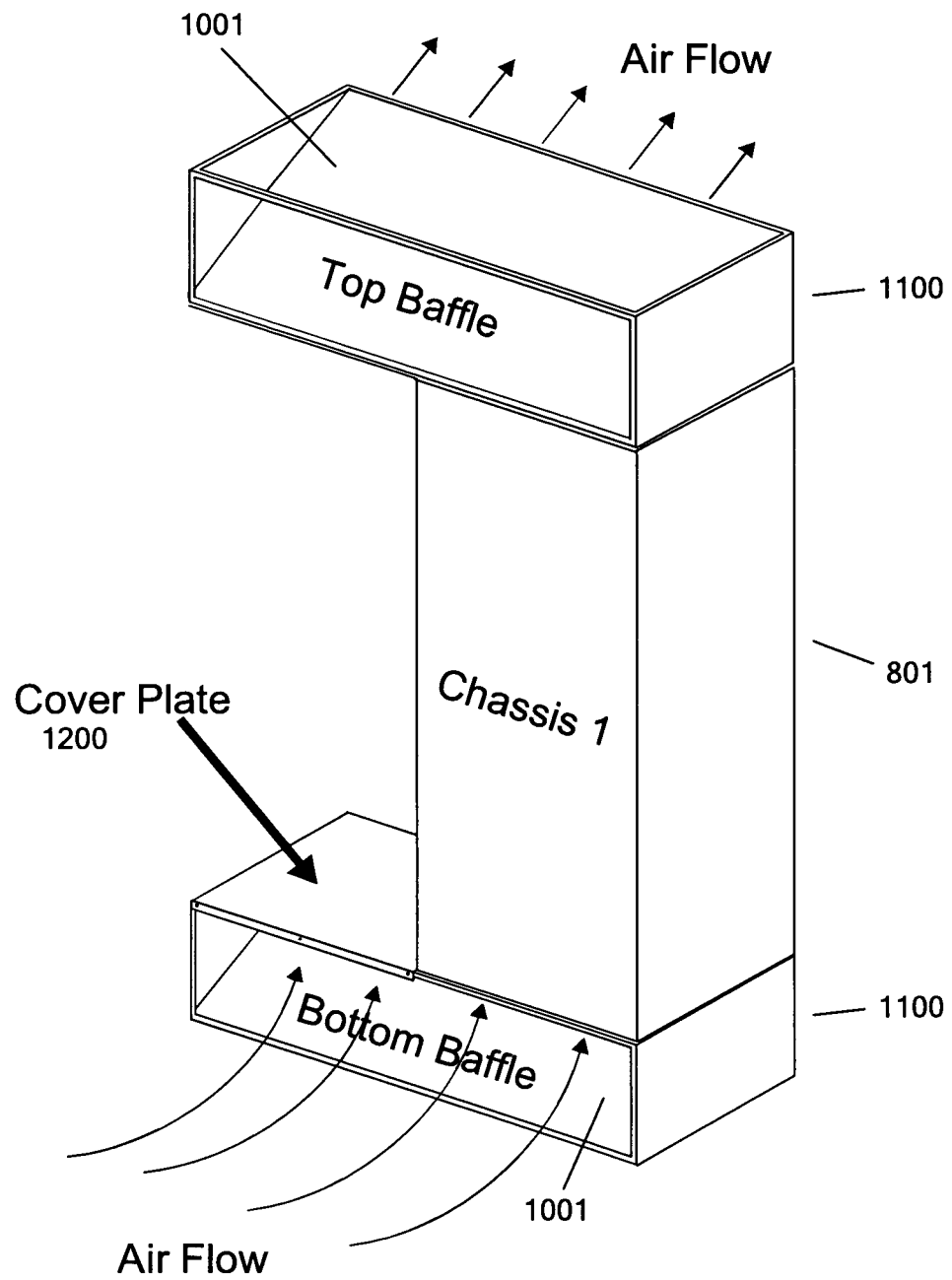
FIG. 12D shows a system in accordance with an example embodiment of the invention.

In FIG. 12C, the system of FIG. 12B is shown with one of the two chassis 801 (labeled 'Chassis 2') of FIG. 12B, removed. With 'Chassis 2' removed, air entering the lower baffle 1100 can be directed by surface 1001 upwardly into the remaining chassis 801 and also through any aperture formed in surface 1002 adjacent the space not occupied by Chassis 2. The air entering the chassis 801 labeled 'Chassis 1' passes through the chassis and through the upper baffle 1100 to exhaust rearward. The system shown in FIG. 12C can be modified as shown in FIG. 12D, where a cover plate 1200 is positioned over the portion of the surface 1002 of the lower baffle 1100 that is not facing a ventilation surface of a chassis. The addition of the cover plate 1200 further directs the incoming air into the chassis labeled Chassis 1.

Figure 13:
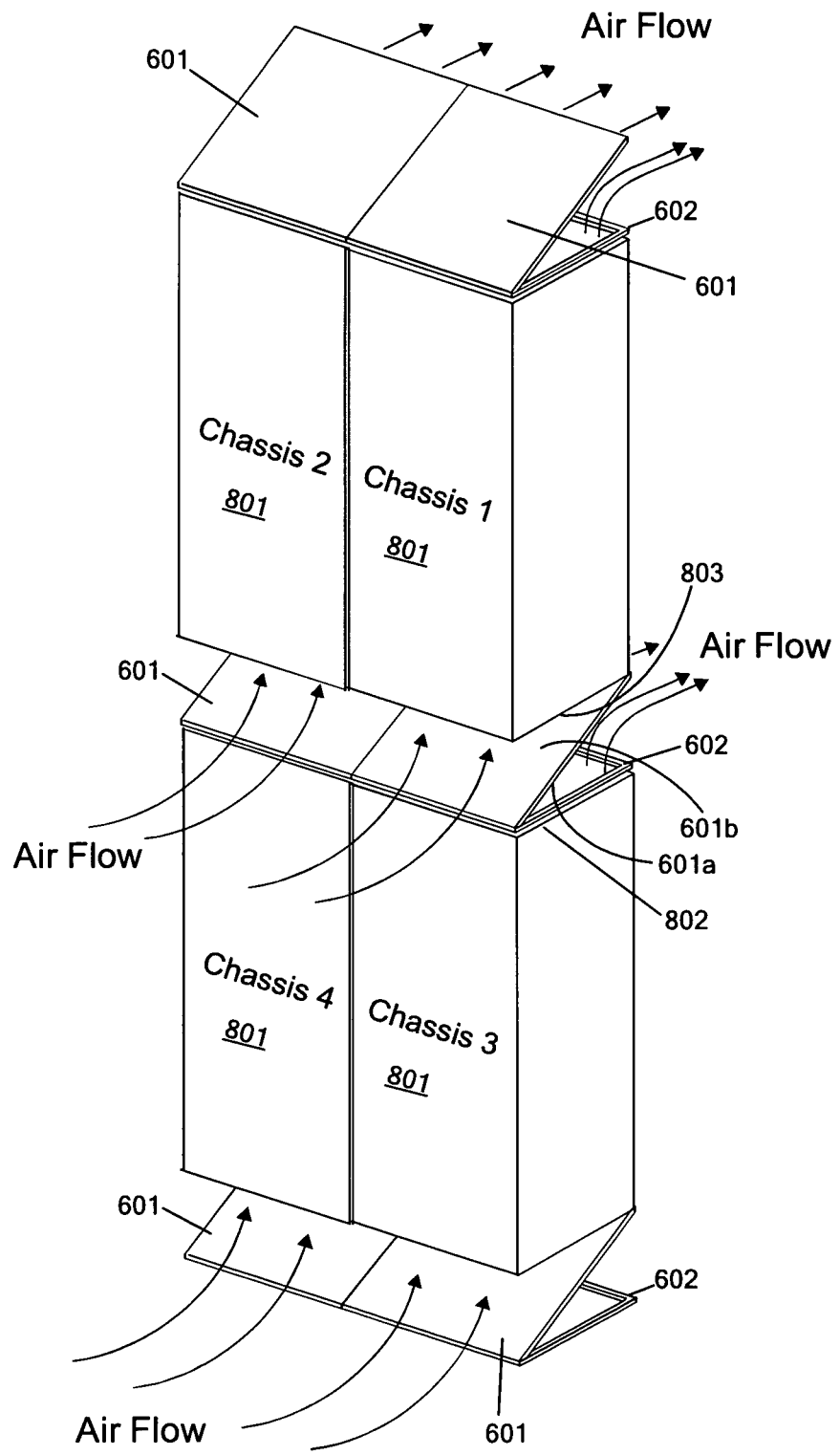
FIG. 13 shows a system in accordance with an example embodiment of the invention.

Another example embodiment of an enclosure venting system is shown in FIG. 13, where a plurality of chassis are arranged both horizontally and vertically adjacent to one another. In particular, in the system shown in FIG. 13 two chassis are positioned horizontally adjacent to each other in a first row and are both positioned directly above a second row of two adjacent chassis. A plurality of baffles (such as baffles 700) are interposed between the rows of chassis, the baffles shown with all sides removed except for the surfaces 601 and 602 for greater clarity. The surfaces 601 and 602 are positioned facing the ventilation surfaces 802 and 803 of the chassis to direct air in a direction to or from (as the case may be) the desired ventilation surface. For example, for each baffle, side 601b of surface 601 directs incoming air from the front of the chassis towards the lower ventilation surface 803, and side 601a of surface 601 directs incoming air from the upper ventilation surface 802 towards the rear of the chassis.

Also, the plurality of surfaces 601 and 602 shown above and below the plurality of chassis in the system of FIG. 13 can also be replaced by common elongated baffle surfaces, such as, for example, surfaces 1001 and 1002 (see, e.g., FIG. 11), in a similar manner as described above with respect to the replacement of surfaces 601 and 602 of the baffles 700 of FIG. 12.

Figure 14:
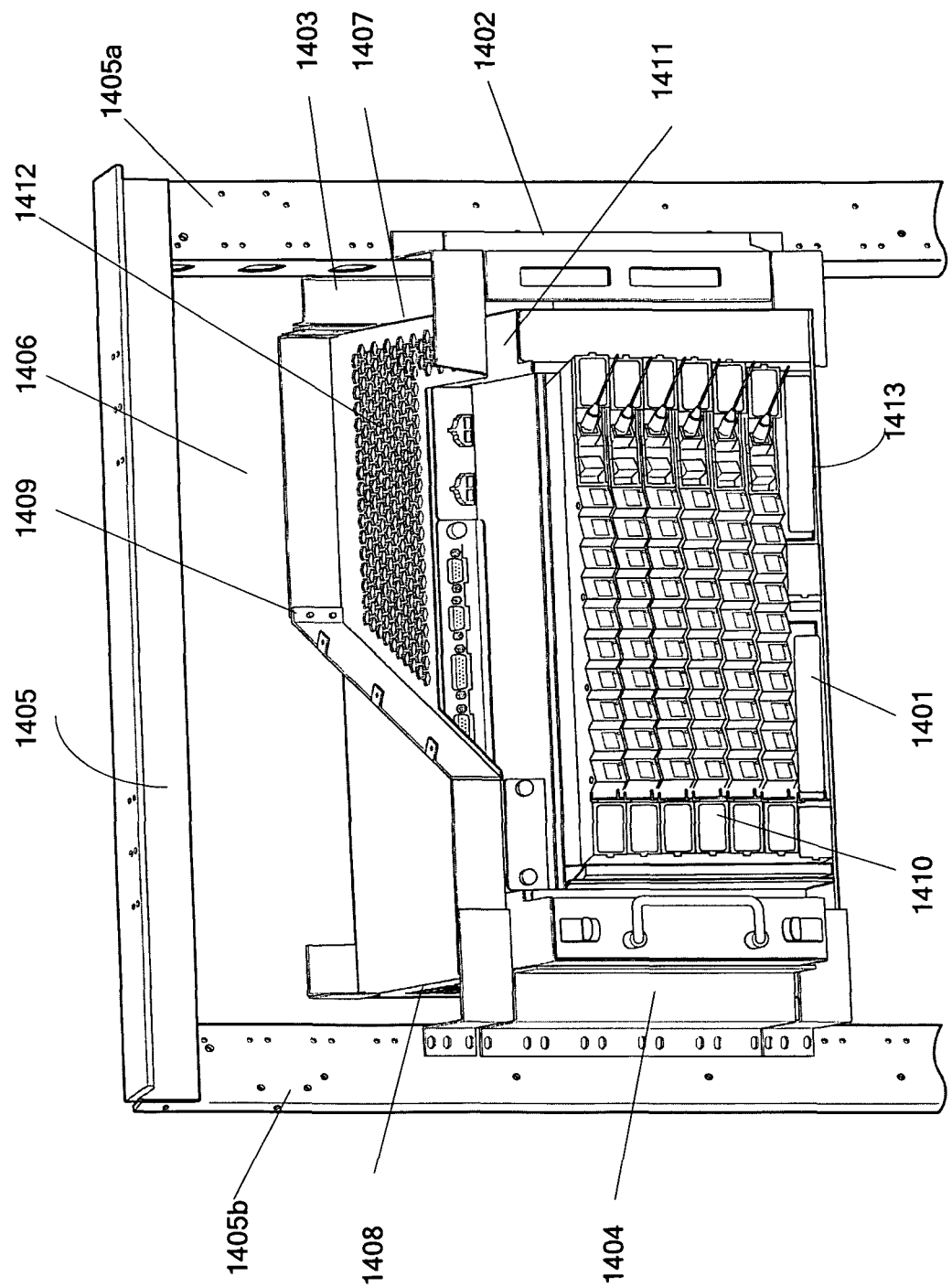
FIG. 14 shows a system in accordance with an example embodiment of the invention.
Figure 15:
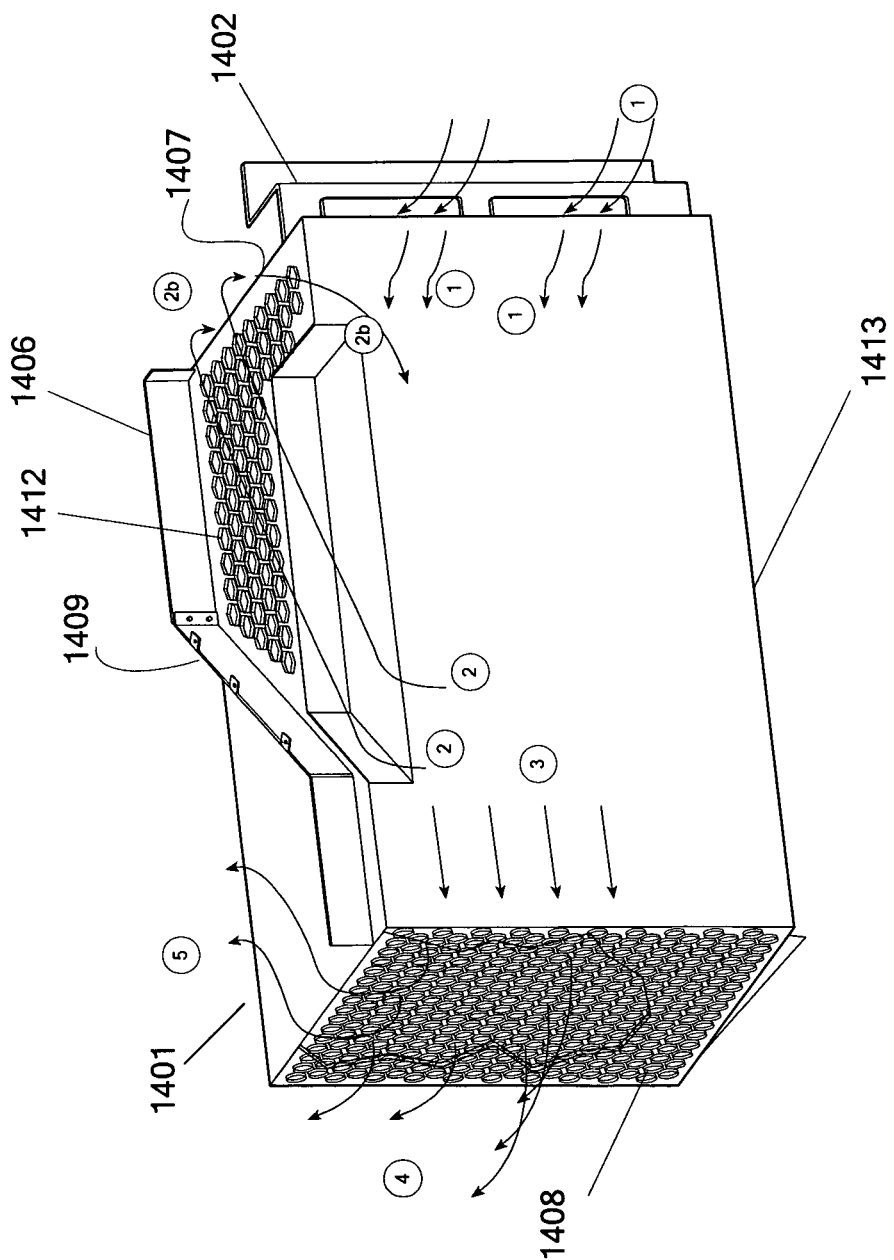
FIG. 15 shows a schematic of the system in accordance with an example embodiment of the invention of FIG. 14.

Another example embodiment of a system for venting a chassis is shown in FIGS. 14 and 15. The system is comprised of a plurality of brackets 1402-1404 connecting a chassis 1401 to a rack 1405. The rack 1405 includes vertical rack supports 1405a and 1405b, which may or may not contain apertures through which air can pass. Alternatively, in other example embodiments, the rack supports 1405a and 1405b can be replaced with side panels of a cabinet or other enclosure.

The chassis 1401 can house various components, such as modular electronic components 1410 shown in FIG. 14. The system can also include a baffle 1406 that includes at least one air directing surface 1409 to redirect air in a direction relative to at least one ventilation surface 1407, 1408 of the chassis 1401. While the baffle surface 1409 is shown exposed in FIGS. 14 and 15 for greater clarity, the baffle 1406 may be configured to be housed within a housing having a bottom side, such as, for example, side 1412, and top side, which is not shown in FIG. 14 for clarity of the view of the interior of the baffle 1406. Each side may contain at least one aperture formed therein, such as, for example, those shown in side 1412. In FIG. 14, the air directing surface 1409 is shown connected to bottom side 1412 of the baffle 1406, but as just described may be connected to a top surface (not shown). The bottom side 1412 is shown as containing at least one aperture formed therein.

In an alternative embodiment, the surface 1409 may not be housed and may be integrally formed with the top side of the chassis 1401 or may be a separate piece that may be positioned similarly as shown in FIG. 14 and/or attached to the mounting elements 1405a and 1405b with a suitable attachment device. For example, in one example embodiment the surface 1409 can be attached to at least one mounting flange that can align with a corresponding mounting location on a mounting surface, such as rack support 1405b and/or 1405a. Mechanical fasteners can be used to join the mounting flange to at least one of those rack supports 1405b, 1405a.

As configured in FIG. 14, air can pass through the chassis 1401 from right to left, through at least one aperture in each of the ventilation surfaces 1407 and 1408. In FIG. 14, bracket 1403 is shown similar in size to bracket 1402, which each are shown as extending between the top and bottom sides of the chassis 1401. Also, as shown in FIG. 14 bracket 1402 is shown as including apertures formed therein, while bracket 1403 is shown as being substantially free of apertures (i.e., has solid surfaces). Bracket 1403 can be used, at least in part, to prevent air exhausting to the rear of the chassis from re-entering the space between brackets 1402 and 1403 and rack support 1405a.

As the example embodiment of the system shown in FIGS. 14 and 15 is configured, air can be directed to flow around and through the chassis as shown by the arrows in FIG. 15, in which solid arrows are intended to represent air flow external to the chassis 1401 and dashed arrows are intended to represent air flow internal to the chassis. Air can pass through at least one aperture formed in the bracket 1402 and enter an area surrounded by brackets 1402, 1403 (FIG. 14), ventilation surface 1407, and the vertical support 1405a (FIG. 14), before passing through at least one aperture formed in the ventilation surface 1407 and into the chassis 1401, as shown by arrows labeled 1. Air can also move from the front of the chassis over the surface 1412 of the baffle 1406, as shown by arrows numbered 2. Air entering the baffle 1406 from the front of the chassis 1401 can be directed toward the ventilation surface 1407 by the surface 1409. The air entering across surface 1412, represented by arrows numbered 2b, is directed to the right, whereupon it can be deflected by brackets 1402 and 1403, and the vertical support 1405a to turn downwardly towards the vertical surface 1407, whereupon the air (2b) can pass through at least one aperture formed in the ventilation surface 1407 and enter the chassis 1401. The combined air flow entering and passing through the chassis therefore includes at least the flow of air represented by arrows numbered 1 and 2b, resulting in bulk air flow, represented by arrow number 3.

The bulk air flow (represented by arrow number 3), can exhaust from the chassis 1401 through at least one aperture formed in the ventilation surface 1408, and the subsequent directions of flow can include those represented by the arrows numbered 4 and 5. Air exiting the chassis 1401, represented by arrows numbered 4, can be directed by bracket 1404 and rack support 1405b towards the rear and left of the chassis 1401, as well as upwardly to the left of the chassis. Moreover, air exiting the chassis 1401, represented by arrows numbered 5, can be directed by bracket 1404 and rack support 1405b and the baffle surface 1409, at least to an area directly behind the chassis 1401.

The scope of the example embodiments of the systems shown in FIGS. 14-17 are not limited to use in conjunction with specific configurations of the chassis (e.g., 1401, 1421) shown therein, and such systems may in fact be used in conjunction with other suitable chassis or enclosure arrangements. For example, another chassis, similar to chassis 1401, 1421, used in conjunction with the system shown in FIGS. 14-15 may include at least one aperture formed on a side of the chassis, such as, for example, a top side of the chassis. In such an alternative configuration of a chassis, an aperture formed in the top side of the chassis may align with a side of the baffle 1406, which may alter the air flow around and through the chassis. For example, with reference to the systems shown in FIGS. 14-17, in an instance where the chassis 1401 included an aperture in the top side, air may pass into the chassis 1400 through an aperture in the top side. Moreover, in an instance where the chassis 1401 included an aperture in the bottom side, air may pass into the chassis 1401 through that aperture in the bottom side.

Figure 16:
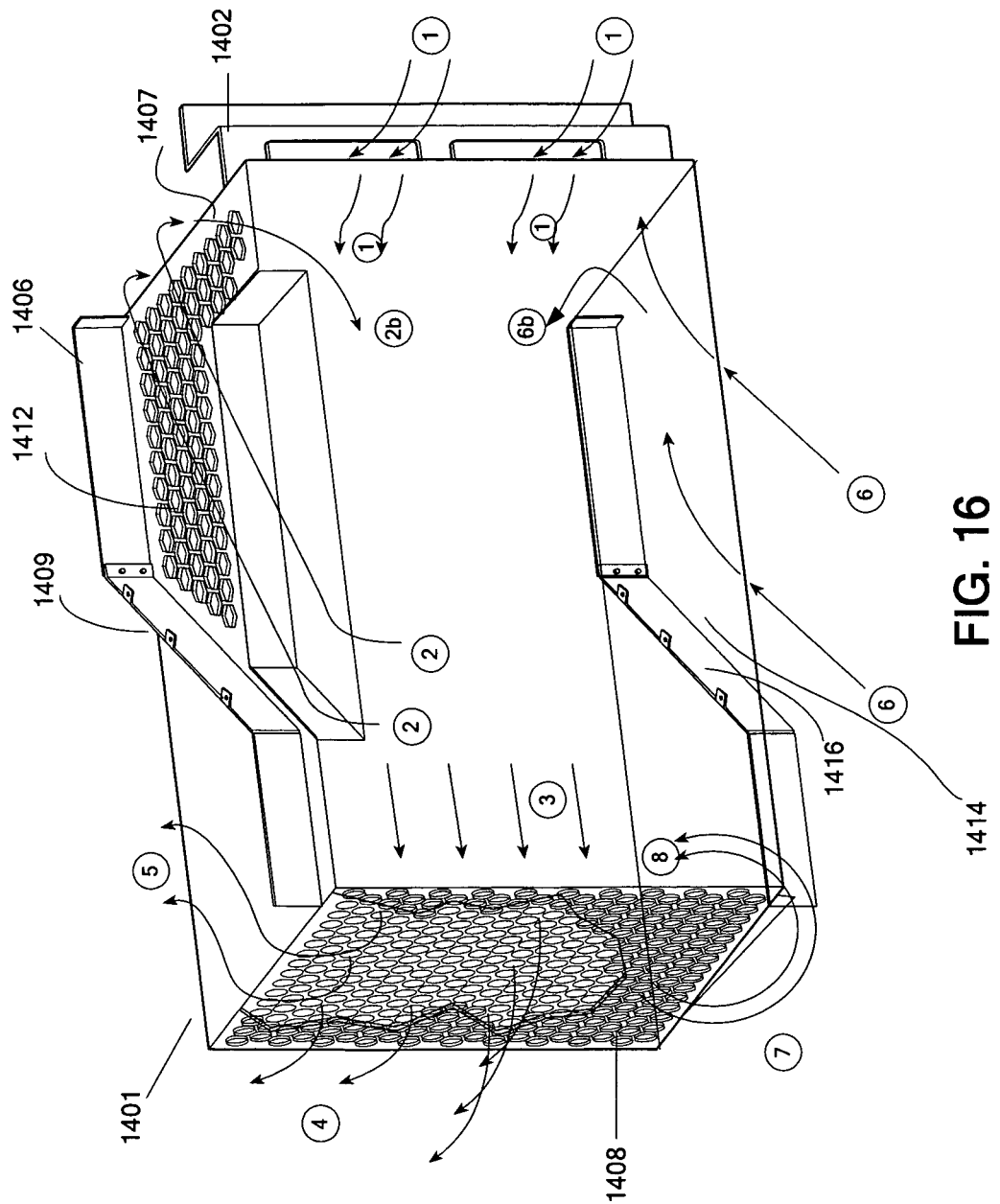
FIG. 16 shows a schematic of a system in accordance with an example embodiment of the invention.

The embodiment of the system shown in FIGS. 14 and 15 can be modified by including a second baffle 1414, similar in construction to baffle 1406, disposed adjacent to a bottom side 1413 of the chassis 1401, as shown in FIG. 16. The baffle 1414 includes at least the air directing surface 1416, which may be housed in a housing including a top side and a bottom side, both of which are not shown for clarity. Air entering the second baffle from the front of the chassis 1401, represented by an arrow numbered 6, can be directed towards the vertical surface 1407 by an air directing surface 1416. Air, represented by arrow number 6*b*, can then enter the chassis 1401 through the at least one aperture in surface 1407, whereupon it can mix with other incoming air represented by arrows numbered 1 and 2*b*.

A bulk air flow, represented by arrow number 3, passes through the chassis 1401 toward and through at least one aperture in side 1408. Upon passing through side 1408 the air flow can be further directed by air directing surfaces of the bracket 1404 (FIG. 14) and rack support 1405*b* (FIG. 14), to direct at least a portion of the bulk airflow downward (as represented by arrow number 7) in a direction toward the baffle 1414. The air then can enter the exhaust side of the baffle 1416 and be further directed by surface 1416 in a direction substantially to the rear of the chassis, similar to that shown by air flow arrow number 8.

In FIG. 17, an example embodiment of a system that can be used in conjunction with the system shown in FIG. 16 may also be configured to provide ventilation for at least one other chassis as well, such as chassis 1421, disposed below the baffle 1414 (FIGS. 16 and 17). In FIG. 17, chassis 1421 is positioned with respect to the baffle 1414 and chassis 1401 so that chassis 1421 is substantially aligned with the upper disposed chassis 1401, and such that the baffle 1414 can direct air relative to at least the two chassis, 1401, 1421. In FIG. 17 a portion of air (represented by arrow number 6*b*) of the air entering from the front (represented by arrow number 6) of the baffle 1414, can be directed by surface 1416 upwards toward ventilation surface 1407 of the upper disposed chassis 1401, and another portion of the air (represented by arrow number 6*c*) can be directed downward toward a ventilation surface 1427 of the lower disposed chassis 1421 in a similar manner as described above. Also, a portion of air, represented by arrow 6*a*, can be directed through at least one aperture formed in a lower surface of a housing of the baffle 1414, and/or the top side of the chassis 1421, into the chassis 1421. Air (represented by arrow number 14) can then be directed by surface 1416 toward the rear of the chassis 1401, 1421, and the baffle 1414, as represented by arrow number 8. Also, air flow, represented by arrow number 7, coming from the ventilation surface 1408, can also be directed by air directing surfaces (e.g., 1404, 1405*b* of FIG. 14) positioned with respect to surface 1408 toward baffle 1414 and can mix with the air (represented by arrow number 14) exhausting from chassis 1421 prior to entering the baffle 1414, and exhausting from the baffle as shown by arrow 8.

In the example embodiment of the system shown in FIG. 17, air flow, represented by arrows numbered 9, can pass through at least one aperture formed in a mounting bracket connecting the chassis 1421 to a vertical rack support, such as 1405(*a*) shown in FIG. 14. Moreover, air flow, represented by arrow number 10*b*, can enter through a third baffle 1424, passing through ventilation surface 1427 and mixing with the air represented by arrow 6*c* and 9. The bulk air flow passing through the chassis 1421, represented by arrow number 15, can then move in a direction towards and through at least one aperture formed in the ventilation surface 1428. Air can then be directed to the rear and/or upward (as represented by arrow 13) and downward (as represented by arrow number 11) toward the baffle 1424. Air (represented by arrow number 11) entering the baffle 1424 can then be directed by surface 1426 toward the rear of the chassis 1401, 1421, and the baffle 1424.

An example embodiment of a method of ventilating a chassis (e.g., 1800, 1801, 1401, 2200, 2300) having at least one ventilation surface (e.g., 1407, 1806, 803, 2207) with apertures formed therein to permit air to pass therethrough is also provided. The method includes receiving at least one air directing surface (e.g., 1409, 601, 1001, 2110, 402, 2202) airflow moving in a first direction, the at least one air directing surface being disposed externally from the chassis (e.g., 1800, 1801, 1401, 2200, 2300) at a predetermined placement relative to the at least one ventilation surface (e.g., 1407, 1806, 803, 2207) in a path of the airflow, the at least one air directing surface (e.g., 1409, 601, 1001, 2110, 402, 2202) having a configuration to alter the direction of the airflow between the air directing surface and the at least one ventilation surface. The method also includes redirecting the airflow between the at least one air directing surface (e.g., 1409, 601, 1001, 2110, 402, 2202) and the at least one ventilation surface (e.g., 1806, 2207, 802, 1408) to at least a second direction using the air directing surface. The predetermined placement and configuration of the at least one air directing surface determines the second direction in which the airflow is discharged, and the second direction is either towards or away from the at least one ventilation surface. The method can be performed in conjunction with, for example, at least one of the example embodiments of the apparatus and systems described herein.

The above described embodiments of the apparatus, system, and method of ventilating an equipment chassis are useful in various ways. As but one example, by virtue of the above described method, apparatus, and system, ventilation air can be directed to and/or away from a chassis which, conventionally, could not be used in a desired mounting environment because access to ventilation was restricted or unavailable. A single chassis can be configured to be used in multiple mounting environments, instead of using a plurality of chassis specifically configured depending on the mounting environment. By avoiding modification of the chassis or the mounting structures themselves, in favor of controlling the direction of airflow into and out of the chassis using the apparatus, system, and method described herein, it is possible to use one chassis in more than one mounting environment. By doing so, for example, equipment designers and manufacturers can standardize on a reduced number of chassis configurations and compatible components. The ability to create standard chassis and component product families can also reduce the cost of design, manufacturing, distribution, technical support, training, and inventory often required for supporting multiple product families based on physical hardware configurations. Other benefits also exist and will be readily appreciated by one skilled in the art in view of this description. Also, in the systems described herein having multiple chassis, baffles, and the like, other numbers of such components besides those shown and described herein can be employed, depending on applicable operating criteria. Furthermore, the example airflow directions described herein are meant to be illustrative in nature, and the scope of the invention should not be construed as being limited to those examples only. Indeed, it is within the scope of the invention to direct forced or non-forced air in any suitable manner and directions using the inventive aspects of the invention depending on the applicable operating criteria to provide cooling (or heating) in any applicable type of enclosure or volume of space, whether housing heat generating equipment or not.

While the invention has been described in the context of a rack mountable chassis environment, broadly construed, the invention is not so limited. For example, in other example embodiments the chassis may be constructed in a non-rack-mountable configuration.

While the invention has been particularly shown and described with respect to example embodiments thereof, it will be understood by those skilled in the art that changes in form and details may be made therein without departing from the scope and spirit of the invention.

What is claimed is:

1. A method of ventilating a chassis having at least one ventilation surface with at least one aperture formed therein to permit air to pass therethrough, the method comprising:

receiving, at least one first air directing surface, airflow moving in a first direction, the at least one first air directing surface being disposed externally from the chassis at a predetermined placement relative to the at least one ventilation surface in a path of the airflow, the at least one first air directing surface having a configuration to alter the direction of the airflow;

redirecting the airflow between the at least one first air directing surface and the at least one ventilation surface to at least a second direction using the at least one first air directing surface;

wherein the predetermined placement and configuration of the at least one first air directing surface determine the second direction in which the airflow is discharged, and the second direction is either towards or away from the at least one ventilation surface, and wherein the at least one first air directing surface is formed by a bracket that fixedly attaches to a surface of the chassis and to a surface of a mounting structure such that the chassis is supported by the mounting structure by way of the bracket, each of the bracket and the mounting structure being external to the chassis.

2. The method of claim 1, wherein the at least one first air directing surface also is formed by a surface of the mounting structure.

3. The method of claim 1, wherein in the redirecting, the airflow is redirected by at least one surface of the mounting structure.

4. The method of claim 1, further comprising further redirecting the airflow from the second direction to at least one other direction.

5. The method of claim 1, further comprising:

further receiving, at a second air directing surface, airflow from the first air directing surface moving in the second direction, the second air directing surface being disposed externally from the chassis at another predetermined placement relative to the at least one ventilation surface; and further redirecting the airflow in a third direction using the second air directing surface, wherein the predetermined placement and configuration of the second air directing surface determine the third direction in which the airflow is discharged, and the third direction is either towards or away from the at least one ventilation surface.

6. The method of claim 5, wherein the second air directing surface is at least one surface of a baffle.

7. The method of claim 5, wherein the second air directing surface is at least one surface of the mounting structure.

8. The method of claim 1, wherein the first direction is substantially parallel to the ventilation surface.

9. The method of claim 1, wherein receiving includes receiving the airflow in a first direction from at least one air directing surface of a baffle.

10. The method of claim 1, wherein the second direction is substantially perpendicular to the ventilation surface.

11. The method of claim 5, wherein the second air directing surface is formed by another bracket configured to attach the chassis to the mounting structure.

12. The method of claim 11, wherein the second air directing surface also includes a surface of the mounting structure attached to the other bracket.

13. The method of claim 5, wherein in redirecting the airflow between the first air directing surface and the second air directing surface, the airflow passes at least partially through the chassis.

14. The method of claim 5, wherein the third direction is substantially perpendicular to the second direction.

15. The method of claim 1, wherein the first direction is substantially perpendicular to the second direction.

16. The method of claim 5, wherein the second air directing surface receives the redirected airflow passing through another ventilation surface disposed proximate to the second air directing surface.

17. The method of claim 16, wherein the second air directing surface is disposed at an exit end of the chassis opposite from the ventilation surface disposed at an inlet end of the chassis.

18. The method of claim 1, further including generating the airflow with at least one fan disposed within the chassis.

19. The method of claim 1, further including generating the airflow with at least one fan disposed externally from the chassis.

20. The method of claim 5, wherein the first, second, and third directions form a generally serpentine path.

* * * * *